(12) United States Patent
Eun

(10) Patent No.: US 9,768,232 B2
(45) Date of Patent: Sep. 19, 2017

(54) VARIABLE RESISTANCE MEMORY DEVICE AND A METHOD OF MANUFACTURING THE SAME

(71) Applicant: SAMSUNG ELECTRONICS CO., LTD., Suwon-si, Gyeonggi-do (KR)

(72) Inventor: Sung-Ho Eun, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/297,687

(22) Filed: Oct. 19, 2016

(65) Prior Publication Data
US 2017/0243922 A1 Aug. 24, 2017

(30) Foreign Application Priority Data
Feb. 22, 2016 (KR) .................. 10-2016-0020389

(51) Int. Cl.
H01L 45/00 (2006.01)
H01L 27/24 (2006.01)
H01L 23/528 (2006.01)

(52) U.S. Cl.
CPC ........ *H01L 27/2463* (2013.01); *H01L 23/528* (2013.01); *H01L 27/2427* (2013.01); *H01L 45/06* (2013.01); *H01L 45/126* (2013.01); *H01L 45/1233* (2013.01); *H01L 45/142* (2013.01); *H01L 45/143* (2013.01); *H01L 45/144* (2013.01); *H01L 45/1683* (2013.01)

(58) Field of Classification Search
None
See application file for complete search history.

(56) References Cited

U.S. PATENT DOCUMENTS

| | | | |
|---|---|---|---|
| 7,799,596 B2 | 9/2010 | Chang et al. | |
| 8,030,128 B1 | 10/2011 | Sutardja et al. | |
| 8,513,136 B2 | 8/2013 | Park et al. | |
| 8,513,637 B2 | 8/2013 | Lung | |
| 8,729,521 B2 | 5/2014 | Lung et al. | |
| 8,853,665 B2 | 10/2014 | Pellizzer et al. | |
| 8,987,700 B2 | 3/2015 | Lai et al. | |
| 9,520,556 B2* | 12/2016 | Horii | H01L 45/1253 |
| 2007/0236989 A1* | 10/2007 | Lung | H01L 45/06 |
| | | | 365/163 |

(Continued)

*Primary Examiner* — Benjamin Sandvik
(74) *Attorney, Agent, or Firm* — F. Chau & Associates, LLC

(57) ABSTRACT

A variable resistance memory device including a substrate, a first insulation layer disposed on the substrate, first and second conductive lines, and memory units. The first conductive lines are arranged in a first direction on the first insulation layer and extend in a second direction. The second conductive lines are disposed over the first conductive lines, are arranged in the second direction, and extend in the first direction. The memory units are disposed in each area between the first and second conductive lines in a third direction and include a first electrode, a variable resistance pattern, a selection pattern, and a second electrode. The first electrode and the variable resistance pattern include a cross-section having an "L" shape. The variable resistance pattern contacts an upper surface of the first electrode. The second electrode is disposed on the variable resistance pattern. The selection pattern is disposed on the second electrode.

20 Claims, 24 Drawing Sheets

(56) References Cited

U.S. PATENT DOCUMENTS

| | | | | |
|---|---|---|---|---|
| 2010/0047960 A1* | 2/2010 | Chen | .................. | H01L 27/2463 438/102 |
| 2013/0302966 A1* | 11/2013 | Oh | ..................... | H01L 27/2463 438/382 |
| 2013/0336046 A1* | 12/2013 | Oh | ......................... | H01L 45/04 365/163 |
| 2015/0108422 A1 | 4/2015 | Pellizzer et al. | | |
| 2015/0155484 A1 | 6/2015 | Liu et al. | | |
| 2015/0162531 A1 | 6/2015 | Pellizzer et al. | | |
| 2015/0188040 A1 | 7/2015 | Zanderighi et al. | | |

\* cited by examiner

VARIABLE RESISTANCE MEMORY DEVICE AND A METHOD OF MANUFACTURING THE SAME

CROSS-REFERENCE TO RELATED APPLICATIONS

This application claims priority under 35 U.S.C. §119 to Korean Patent Application No. 10-2016-0020389, filed on Feb. 22, 2016 in the Korean Intellectual Property Office, the contents of which are herein incorporated by reference in their entirety.

TECHNICAL FIELD

The present invention relates to a variable resistance memory device and a method of manufacturing the same.

DISCUSSION OF RELATED ART

In a method of manufacturing a variable resistance memory device, a lower electrode, a variable resistance layer, an intermediate electrode layer, a selection layer and an upper electrode layer may be sequentially formed and patterned to form a variable resistance pattern, an intermediate electrode, a selection pattern and an upper electrode, respectively, which are sequentially stacked. During the patterning process, misalignment may occur. Therefore, a contact area between the lower electrode and the variable resistance pattern may change. Additionally, the variable resistance pattern may be damaged during the patterning process.

SUMMARY

Exemplary embodiments of the present invention provide a variable resistance memory device. The variable resistance memory device includes a substrate, a first insulation layer, first conductive lines, second conductive lines, and a plurality of memory units. The first insulation layer is disposed on the substrate. The first conductive lines are arranged in a first direction on the first insulation layer. Each of the first conductive lines extends in a second direction. The second direction is substantially perpendicular to the first direction. The first direction and the second direction are substantially parallel to an upper surface of the substrate. The second conductive lines are disposed over the first conductive lines in the second direction. Each of the second conductive lines extends in the first direction. The plurality of memory units are each disposed in each area between the first conductive lines and the second conductive lines in a third direction. The memory unit includes a first electrode, a variable resistance pattern, a second electrode, and a selection pattern. The first electrode includes an "L" shaped cross-section taken along the first direction. The variable resistance pattern contacts an upper surface of the first electrode. The variable resistance pattern includes an "L" shaped cross-section taken along the first direction. The second electrode is disposed on the variable resistance pattern. The selection pattern is disposed on the second electrode.

Exemplary embodiments of the present invention provide a variable resistance memory device. The variable resistance memory device includes first conductive lines, a first electrode, a plurality of variable resistance patterns, a second electrode, and a selection pattern. The first conductive lines are disposed over a substrate in a first direction. Each of the first conductive lines extends in a second direction. The second direction is substantially perpendicular to the first direction. The first direction and the second direction are substantially parallel to an upper surface of the substrate. The first electrode extends in the second direction. The first electrode is disposed on each of the first conductive lines. The first electrode includes an "L" shaped cross-section taken along the first direction. The variable resistance patterns are spaced apart from each other in the second direction. The variable resistance patterns are disposed on the first electrode. Each of the variable resistance patterns includes an "L" shaped cross-section taken along the first direction. The second electrode is disposed on the variable resistance patterns. The selection pattern is disposed on the second electrode. A lateral surface of each of the variable resistance patterns and a lateral surface of the first electrode are disposed on the same plane extending in a third direction. The third direction is substantially perpendicular to the upper surface of the substrate.

Exemplary embodiments of the present invention provide a method of manufacturing a variable resistance memory device. According to the method, a first insulation layer is formed on a substrate. A plurality of first conductive lines are formed on the first insulation layer in a first direction. A second insulation layer is formed on the first insulation layer and the first conductive lines in the first direction. A plurality of openings are formed in the second insulation layer. The openings partially expose upper surfaces of adjacent first conductive lines in the first direction is. A first electrode is formed on a lower lateral surface in each of the openings. A variable resistance pattern is formed on an upper lateral surface in each of the openings. A second electrode is formed on the variable resistance pattern. A selection pattern is formed on the variable resistance pattern. A lateral surface of the first electrode and a lateral surface of the variable resistance pattern are formed on a same plane. The first electrode and the variable resistance pattern include an "L" shaped vertical cross-section. A width of a lower surface of the variable resistance pattern is greater than a width of a lower surface of the first electrode.

BRIEF DESCRIPTION OF THE DRAWINGS

These and/or other aspects will become apparent and more readily appreciated from the following description of the exemplary embodiments, taken in conjunction with the accompanying drawings, in which.

DETAILED DESCRIPTION OF THE EMBODIMENTS

It will be understood that when a layer, region, or component is referred to as being "formed on" or "disposed on" another layer, region, or component, it can be directly or indirectly formed or disposed on the other layer, region, or component. Therefore, intervening layers, regions, or components may be present.

Hereinafter, two directions substantially parallel to an upper surface of a substrate and crossing each other may be defined as first and second directions, respectively. A direction substantially perpendicular to an upper surface of the substrate may be defined as a third direction. According to exemplary embodiments of the present invention, the first and second directions may cross each other at a right angle so as to be substantially perpendicular to each other.

Figure 1:
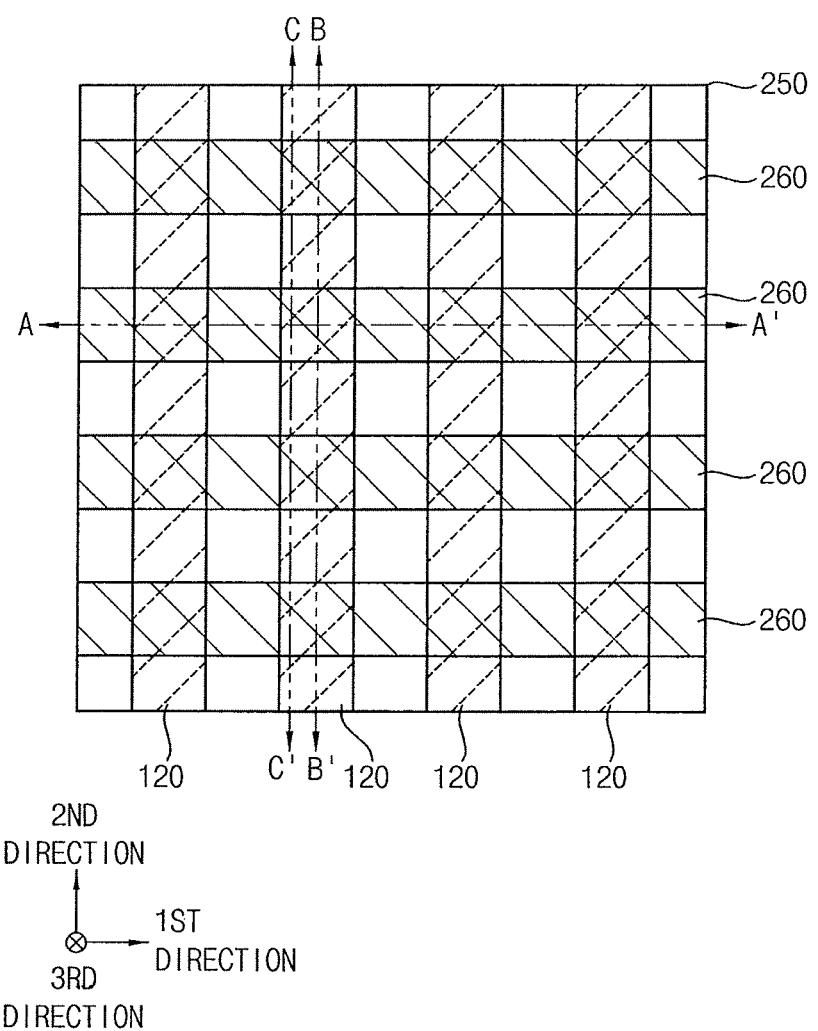
FIG. 1 is a plan view illustrating a variable resistance memory device according to an exemplary embodiment of the present invention.
Figure 2:
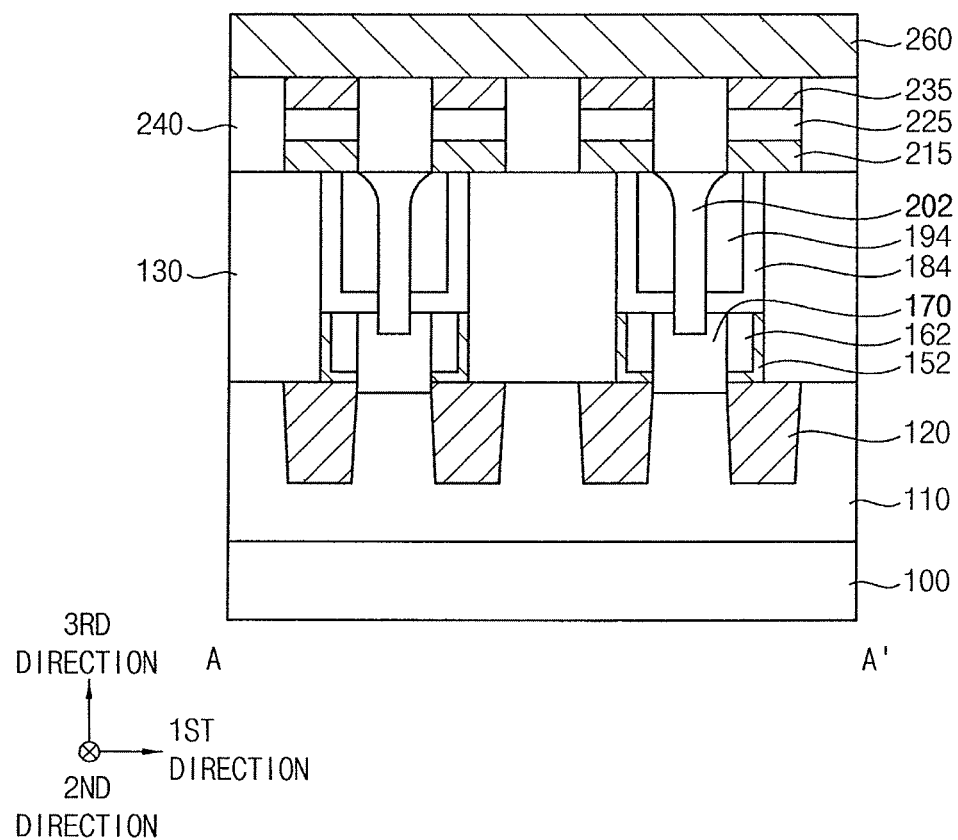
FIGS. 2 to 6 are cross-sectional views illustrating a variable resistance memory device of FIG. 1 according to an exemplary embodiment of the present invention.
Figure 3:
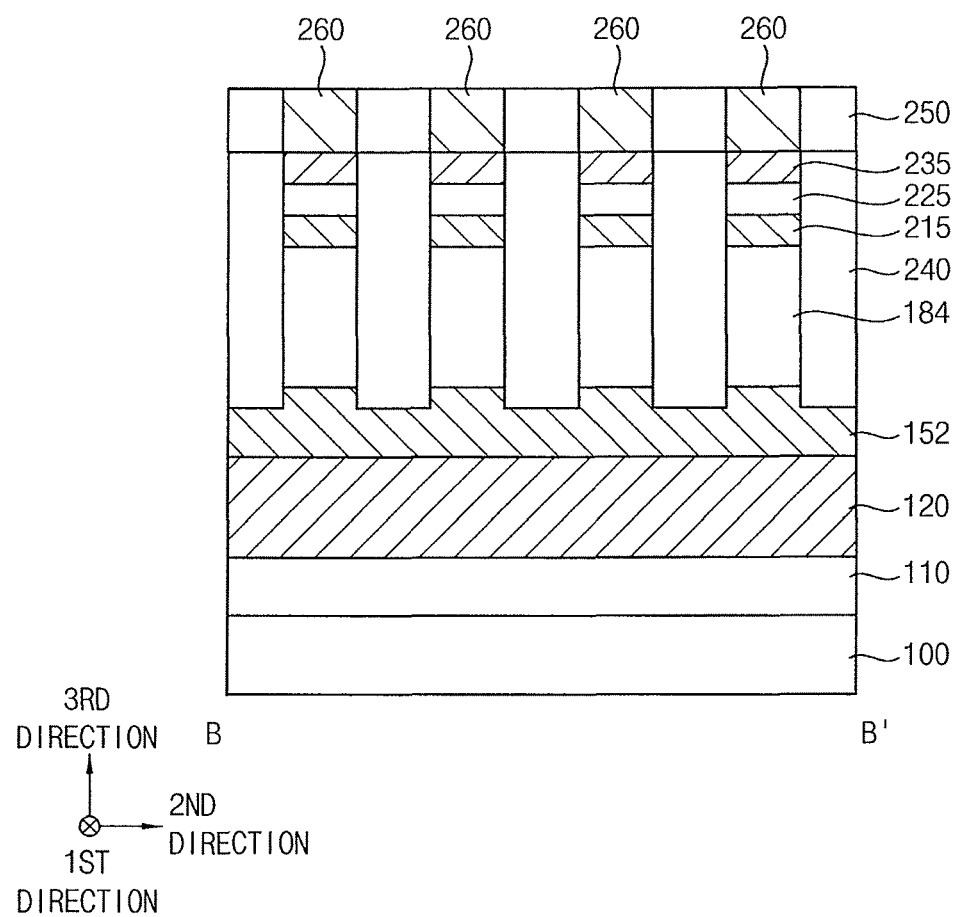
Figure 4:
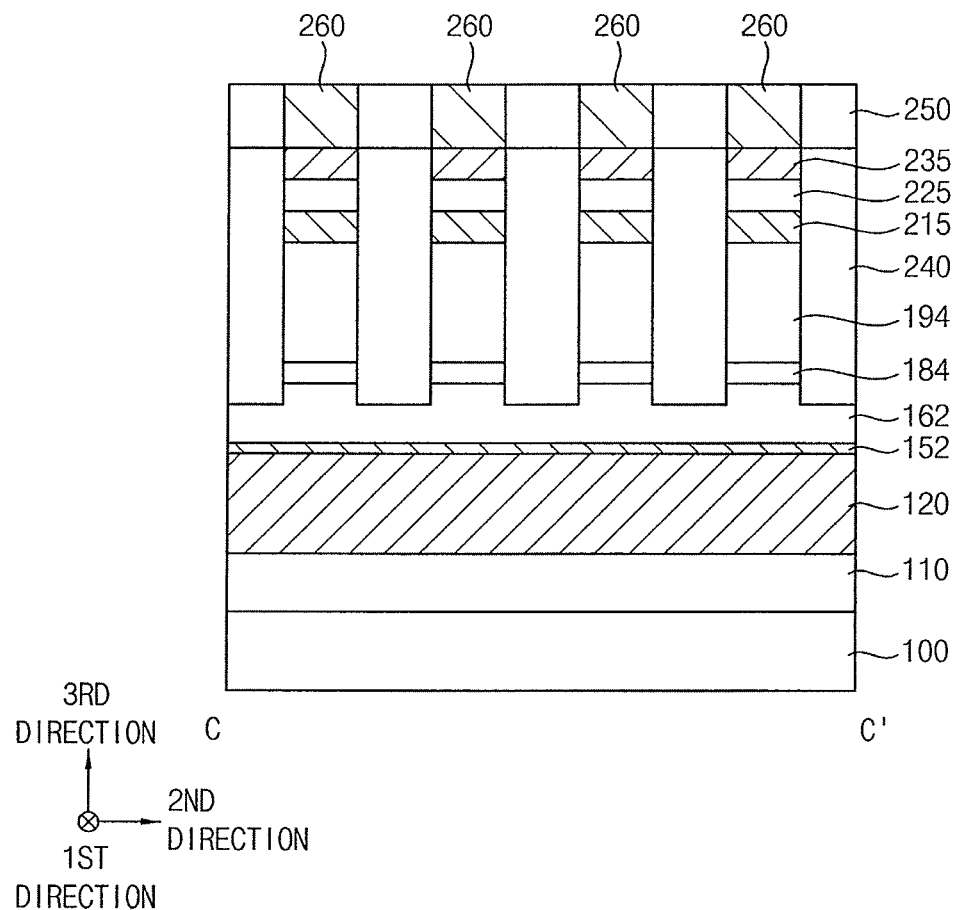
Figure 5:
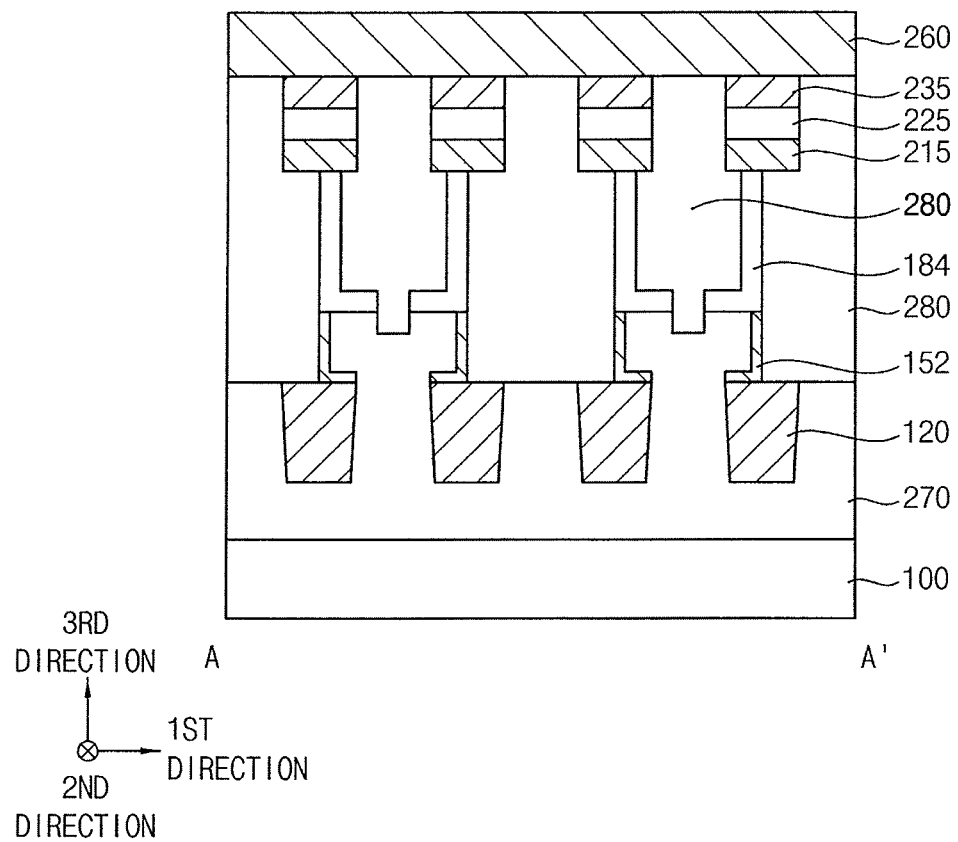
Figure 6:
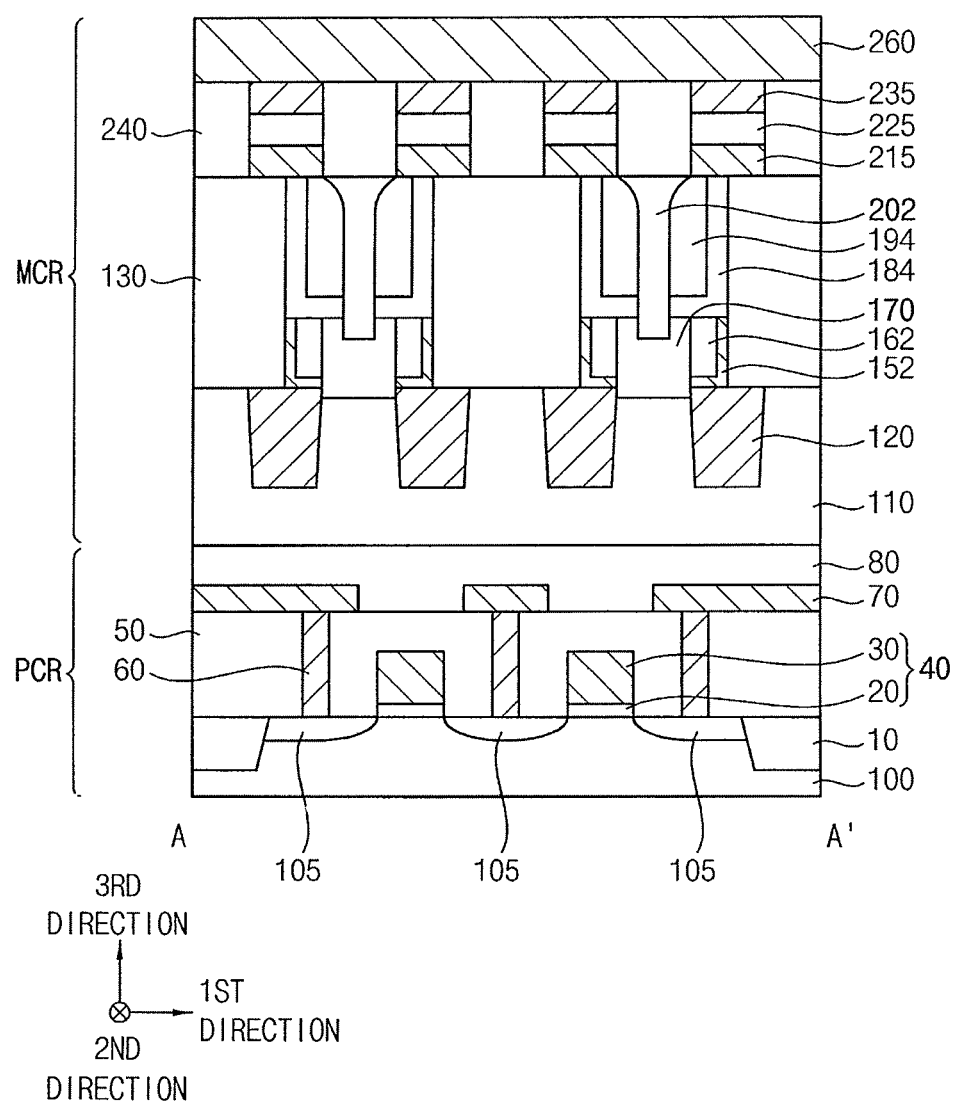

FIG. 1 is a plan view illustrating a variable resistance memory device according to an exemplary embodiment of the present invention. FIGS. 2 to 6 are cross-sectional views illustrating a variable resistance memory device of FIG. 1 according to an exemplary embodiment of the present invention. FIGS. 2, 5 and 6 are cross-sectional views taken along lines A-A' of FIG. 1. FIG. 3 is a cross-sectional view taken along a line B-B' of FIG. 1. FIG. 4 is a cross-sectional view taken along a line C-C' of FIG. 1.

Referring to FIGS. 1 to 4, the variable resistance memory device may include a first conductive line 120, a second conductive line 260, and a first memory unit. The variable resistance memory device may further include a first insulation layer 110, a second insulation layer 130, a third insulation layer 240, and a fourth insulation layer 250. The variable resistance memory device may include a first spacer 162 and a second spacer 194. The variable resistance memory device may further include a first filling pattern 170 and a second filling pattern 202.

The variable resistance memory device may include a substrate 100. The substrate 100 may include a semiconductor material, for example, silicon (Si), germanium (Ge), silicon-germanium, or III-V semiconductor compounds, for example, gallium phosphide (GaP), gallium arsenide (GaAs), or gallium antimonide (GaSb); however, exemplary embodiments of the present invention are not limited thereto. According to an exemplary embodiment of the present invention, the substrate 100 may include a silicon-on-insulator (SOI) substrate or a germanium-on-insulator (GOI) substrate; however, exemplary embodiments of the present invention are not limited thereto.

Various components, for example, gate structures, impurity layers, contact plugs, and/or wirings, may be formed on the substrate 100. The various components may be covered by the first insulation layer 110.

The first insulation layer 110 may include an oxide, for example, silicon oxide; however, exemplary embodiments of the present invention are not limited thereto.

The first conductive line 120 may be formed on the first insulation layer 110. According to exemplary embodiments of the present invention, the first conductive line 120 may extend in a second direction. Furthermore, a plurality of first conductive lines 120 may be formed on the first insulation layer 110. The plurality of first conductive lines 120 may be spaced apart from each other in a first direction.

The second conductive line 260 may be disposed over the first conductive line 120. The second conductive line 260 may be spaced apart from the first conductive line 120. The second conductive line 260 may extend in the first direction. A plurality of second conductive lines 260 may be disposed over the first conductive line 120. The second conductive lines 260 may be spaced apart from each other in the second direction.

The second conductive lines 260 may extend through the fourth insulation layer 250. The fourth insulation layer 250 may include a nitride, for example, silicon nitride ($Si_3N_4$); however, exemplary embodiments of the present invention are not limited thereto.

The first conductive line 120 and the second conductive lines 260 may include a metal, for example, tungsten (W), platinum (Pt), palladium (Pd), rhodium (Rh), ruthenium (Ru), iridium (Ir), copper (Cu), aluminum (Al), titanium (Ti), tantalum (Ta), or a metal nitride thereof; however, exemplary embodiments of the present invention are not limited thereto.

According to an exemplary embodiment of the present invention, the first conductive line 120 may include a first metal pattern. The first conductive line 120 may also include a first barrier pattern. The first barrier pattern may cover a lateral surface and a lower surface of the first metal pattern. The second conductive line 260 may include a second metal pattern. The second conductive line 260 may also include a second barrier pattern. The second barrier pattern may cover a lateral surface and a lower surface of the second metal pattern. The first metal pattern and the second metal pattern may include a metal. The first barrier pattern and the second barrier pattern may include a metal nitride, for example, titanium nitride (TiN), tantalum nitride (TaN), or tungsten nitride; however, exemplary embodiments of the present invention are not limited thereto.

According to an exemplary embodiment of the present invention, the first conductive line 120 may be configured and serve as a word line of the variable resistance memory device. The second conductive line 260 may be configured and serve as a bit line of the variable resistance memory device. Alternatively, the first conductive line 120 may be configured and serve as a bit line of the variable resistance memory device. The second conductive line 260 may be configured and serve as a word line of the variable resistance memory device.

The first memory unit may be formed between the first conductive lines 120 and the second conductive lines 260. Specifically, the first memory unit may be formed at a region where the first conductive lines 120 and second conductive lines 260 overlap each other in a third direction. Therefore, a plurality of first memory units may be formed on each of the first conductive lines 120 in the second direction to overlap the second conductive lines 260, respectively. A plurality of first conductive lines 120 may be formed in the first direction. Therefore, a plurality of first memory units may also be formed in the first direction.

The first memory unit may include a first electrode 152, a first variable resistance pattern 184, a second electrode 215, a first selection pattern 225, and a third electrode 235.

According to an exemplary embodiment of the present invention, the first electrode 152 may extend in the second direction on each of the first conductive lines 120. A plurality of first electrodes 152 may be formed in the first direction. A plurality of first electrodes 152 may be formed in the first direction, however, each of the first electrodes 152 may extend in the second direction.

The first electrode 152 may have an "L" shape in a cross-section taken along the first direction. Therefore, the first electrode 152 may include a vertical portion extending in the third direction on a central upper surface of the first conductive line 120. The first electrode 152 may further include a horizontal portion. The horizontal portion of the first electrode 153 may be connected to the vertical portion of the first electrode 153. The horizontal portion of the first electrode 152 may extend in the first direction on a portion of the upper surface of the first conductive line 120. According to an exemplary embodiment of the present invention, the first electrode 152 may have a substantially constant thickness.

A lateral surface of the first electrode 152 may be substantially aligned with a lateral surface of the first conductive line 120; however, exemplary embodiments of the present invention are not limited thereto. Therefore, the lateral surface of the first electrode 152 might not be aligned with the lateral surface of the first conductive line 120. For example, an edge portion of the upper surface of the first conductive line 120 might not be covered by the first electrode 152.

A lateral surface of the vertical portion and an upper surface of the horizontal portion of the first electrode 152 may be covered by the first spacer 162. The first spacer 162 may include an oxide, for example, silicon oxide; however, exemplary embodiments of the present invention are not limited thereto.

The first filling pattern 170 may be formed between adjacent first structures. Each first structure may include the first spacer 162 and the first electrode 152. The first spacer 162 and the first electrode 152 may be formed in the first direction. According to an exemplary embodiment of the present invention, the first filling pattern 170 may extend in the second direction. A lower surface of the first filling pattern 170 may be lower than an upper surface of the first insulation layer 110 in a cross-section taken along the first direction. An upper surface of the first filling pattern 170 may include a concave central portion. The first filling pattern 170 may include an oxide, for example, silicon oxide; however, exemplary embodiments of the present invention are not limited thereto.

The first electrode 152 may heat the first variable resistance pattern 184. Accordingly, the resistance of the first variable resistance pattern 184 may be changed. The first electrode 152 may include carbon, a metal containing carbon, or a metal nitride containing carbon. For example, the first electrode 152 may include carbon, carbonitride, titanium carbonitride and/or tantalum carbonitride; however, exemplary embodiments of the present invention are not limited thereto.

According to exemplary embodiment of the present invention, a plurality of first variable resistance patterns 184 may be formed in the second direction on the first electrode 152 and the first spacer 162. A plurality of first variable resistance patterns 184 may be also formed in the first direction. Each of the first variable resistance patterns 184 may have an "L" shape in a cross-section taken along the first direction. Accordingly, each of the first variable resistance patterns 184 may include a vertical portion extending in the third direction on an upper surface of the first electrode 152. Each of the first variable resistance patterns 184 may further include a horizontal portion. The horizontal portion of the first variable resistance patterns 184 may be connected to the vertical portion of the first variable resistance patterns 184. The horizontal portion of the first variable resistance patterns 184 may extend in the first direction on the first electrode 152 and the first spacer 162. The first variable resistance pattern 184 may have a substantially constant thickness.

According to an exemplary embodiment of the present invention, a lateral surface of the vertical portion of the first variable resistance pattern 184 may be substantially aligned with a lateral surface of the first electrode 152. Therefore, the lateral surfaces of the vertical portion of the first variable resistance pattern 184 and the first electrode 152 may be on the same plane extending in the third direction.

According to an exemplary embodiment of the present invention, a lower surface of the first variable resistance pattern 184 may have a width in the first direction greater than a width of a lower surface of the first electrode 152; however, exemplary embodiments of the present invention are not limited thereto. Alternatively, the width of the lower surface of the first variable resistance pattern 184 in the first direction may be substantially equal to or less than a width of the lower surface of the first electrode 152.

The first variable resistance pattern 184 and the first electrode 152 may have an "L" shape in a cross-section taken along the first direction. The lateral surfaces of the first variable resistance pattern 184 and the lateral surfaces of the first electrode 152 may be substantially aligned with each other. Therefore, an area of the upper surface of the first electrode 152 contacting the lower surface of the first variable resistance pattern 184 may be substantially constant. Although a plurality of first variable resistance patterns 184 and a plurality of first electrodes 152 may be formed, the distribution of contact areas therebetween may be substantially low to around zero; however, exemplary embodiments of the present invention are not limited thereto.

According to an exemplary embodiment of the present invention, the first electrode 152 may heat the first variable resistance pattern 184. Therefore, the resistance of the first variable resistance pattern 184 may be changed. The distribution of the contact areas between the first variable resistance patterns 184 and the first electrodes 152 may be substantially low to around zero. Therefore, the characteristic distribution between memory cells may be reduced.

Alternatively, the first variable resistance pattern 184 may be heat itself.

According to an exemplary embodiment of the present invention, the first variable resistance pattern 184 may include a material having a resistance that may be changed according to the phase change thereof. The first variable resistance pattern 184 may include a chalcogenide material containing germanium (Ge), antimony (Sb) and/or tellurium (Te): however, exemplary embodiments of the present invention are not limited thereto. The first variable resistance pattern 184 may also include a super lattice. The super lattice may have a multi-layered structure. The super lattice may include a germanium-tellurium (GeTe) layer and an antimony-tellurium ($Sb_2Te_3$) layer; however, exemplary embodiments of the present invention are not limited thereto. The germanium-tellurium (GeTe) layer and the antimony-tellurium ($Sb_2Te_3$) layer may be alternately stacked. The first variable resistance pattern 184 may include an IST containing indium-antimony-tellurium or a BST containing bismuth-antimony-tellurium; however, exemplary embodiments of the present invention are not limited thereto.

According to an exemplary embodiment of the present invention, the first variable resistance pattern 184 may include a perovskite-based material or a transition metal; however, exemplary embodiments of the present invention are not limited thereto. The perovskite-based material may include, for example, STO ($SrTiO_3$), BTO ($BaTiO_3$), PCMO ($Pr_{1-x}Ca_xMnO_3$) and/or the like. The transition metal oxide may include titanium oxide (TiOx), zirconium oxide (ZrOx), aluminum oxide (AlOx), hafnium oxide (HfOx), tantalum oxide (TaOx), niobium oxide (NbOx), cobalt oxide (CoOx), tungsten oxide (WOx), lanthanum oxide (LaOx), and/or zinc oxide (ZnOx).

According to an exemplary embodiment of the present invention, the first variable resistance pattern 184 may include a material having a resistance which may be changed by a magnetic field or a spin transfer torque (STT). The variable resistance memory device may be a magnetic random access memory (MRAM) device. For example, the first variable resistance pattern 184 may include a ferromagnetic material, for example, iron (Fe), nickel (Ni), cobalt (Co), dysprosium (Dy), gadolinium (Gd) or the like; however, exemplary embodiments of the present invention are not limited thereto.

A lateral surface of the vertical portion and an upper surface of the horizontal portion of the first variable resistance pattern 184 may be covered by the second spacer 194. The second spacer 194 may include a nitride, for example, silicon nitride ($Si_3N_4$); however, exemplary embodiments of the present invention are not limited thereto.

The second filling pattern 202 may be formed between adjacent second structures. Each second structure 202 may include the second spacer 194 and the first variable resistance pattern 184. The second spacer 194 and the first variable resistance pattern 184 may be formed in the first direction. According to an exemplary embodiment of the present invention, a lower surface of the second filling pattern 202 may be lower than an upper surface of the first spacer 162 in a cross-section taken along the first direction. An upper surface of the first electrode 152 and an upper surface of the second filling pattern 202 may be substantially coplanar with an upper surface of the second spacer 194 and an upper surface of the first variable resistance pattern 184. A lower portion of the second filling pattern 202 may correspond to and may contact the concave central portion of the first filling pattern 170. The second filling pattern 202 may include a nitride, for example, silicon nitride ($Si_3N_4$); however, exemplary embodiments of the present invention are not limited thereto.

Lateral surfaces of the vertical portions of the first electrode 152 and lateral surfaces of the first variable resistance pattern 184 on the same vertical plane may be covered by the second insulation layer 130. The second insulation layer 130 may be formed on the first insulation layer 110 and the first conductive lines 120. The second insulation layer 130 may cover a lateral surface of the first electrode 152 and a lateral surface of the first variable resistance pattern 184. The second insulation layer 130 may include a nitride, for example, silicon nitride ($Si_3N_4$); however, exemplary embodiments of the present invention are not limited thereto.

The second electrode 215, the first selection pattern 225 and the third electrode 235 may be formed on the first variable resistance pattern 184, the second insulation layer 130 and the second spacer 194 to form a third structure. According to an exemplary embodiment of the present invention, the third structure may contact the first variable resistance pattern 184. A plurality of third structures may be formed in each of the first direction and the second direction.

Lateral surfaces of the third structure may be covered by the third insulation layer 240 formed on the second insulation layer 130. The third insulation layer 240 may be formed on the first electrode 152, the first spacer 162 and the first filling pattern 170. The third insulation layer 240 may cover lateral surfaces of the first variable resistance pattern 184, the second spacer 194 and the second filling pattern 202. The third insulation layer 240 may include a nitride, for example, silicon nitride ($Si_3N_4$); however, exemplary embodiments of the present invention are not limited thereto.

Each of the second electrodes 215 and the third electrodes 235 may include a metal nitride or a metal silicon nitride, for example, titanium nitride, titanium silicon nitride, tungsten nitride, tungsten silicon nitride, tantalum nitride, tantalum silicon nitride, zirconium nitride, and/or zirconium silicon nitride; however, exemplary embodiments of the present invention are not limited thereto.

According to an exemplary embodiment of the present invention, the first selection pattern 225 may include an ovonic threshold switch (OTS) material. The ovonic threshold switch (OTS) material may be configured as a switching element by the resistance difference due to the temperature difference in an amorphous state.

The ovonic threshold switch (OTS) material may include, for example, germanium (Ge), silicon (Si), arsenic (As) and/or tellurium (Te), and may further include selenium (Se) and/or sulfur (S); however, exemplary embodiments of the present invention are not limited thereto.

The ovonic threshold switch (OTS) material may include, for example, AsTeGeSiIn, GeTe, SnTe, GeSe, SnSe, AsTeGeSiSbS, AsTeGeSiIP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}Se_{50}Sb_2$, $Si_5Te_{34}As_{28}Ge_{11}S_{21}Se_1$, AsTeGe-SiSeNS, AsTeGeSiP, AsSe, AsGeSe, AsTeGeSe, ZnTe, GeTePb, GeSeTe, AlAsTe, SeAsGeC, SeTeGeSi, GeSb-TeSe, GeBiTeSe, GeAsSbSe, GeAsBiTe, GeAsBiSe, and/or $Ge_xSe_{1-x}$; however, exemplary embodiments of the present invention are not limited thereto.

Alternatively, the first selection pattern 225 may include a polysilicon (poly-Si) layer doped with N-type impurities. The first selection pattern 225 may further include a polysilicon (poly-Si) layer doped with P-type impurities. The polysilicon (poly-Si) layer doped with N-type impurities and the polysilicon (poly-Si) layer doped with P-type impurities may be stacked, for example, to form a diode.

According to an exemplary embodiment of the present invention, a plurality of first memory units except the first electrode 152 may be formed in each of the first and second directions. Furthermore, the plurality of first memory units except the first electrode 152 may be disposed in a grid pattern in a plan view.

The fourth insulation layer 250 containing the second conductive lines 260 may be formed on the third insulation layer 240 and the third electrodes 235.

In a variable resistance memory device according to an exemplary embodiment of the present invention, the first electrode 152 and the first variable resistance pattern 184 may be stacked and may be substantially aligned with each other. Therefore, the contact areas between the first electrode 152 and the first variable resistance pattern 184 may be substantially constant. Accordingly, the variable resistance memory device including the plurality of first electrodes 152 and the plurality of first variable resistance patterns 184 may have a reduced characteristic distribution among memory cells.

Referring to FIG. 5, the first insulation layer 110, the first spacer 162 and the first filling pattern 170 may include substantially the same material. The first insulation layer 110, the first spacer 162 and the first filling pattern 170 may be merged with each other and may form a fifth insulation layer 270. The second insulation layer 130, the third insulation layer 240, and the fourth insulation layer 250, the second spacer 194 and the second filling pattern 202, may include substantially the same material. The second insulation layer 130, the third insulation layer 240 and the fourth insulation layer 250 may be merged with each other to form a sixth insulation layer 260.

The variable resistance memory device may include a cell over peri (COP) structure. The cell over peri (COP) structure may include peripheral circuits and memory cells. The peripheral circuits and memory cells may be stacked, as illustrated in FIG. 6.

Referring to FIG. 6, the variable resistance memory device may include a peripheral circuit region (PCR) and a memory cell region (MCR). The memory cell region (MCR) may be disposed on the peripheral circuit region (PCR).

According to an exemplary embodiment of the present invention, a gate structure 40, an impurity region 105, a first contact plug 60 and a wiring 70 may be formed on the substrate 100. An isolation layer 10 may be formed on the substrate 100 in the peripheral circuit region (PCR). The first conductive line 120, the second conductive line 260, the first memory unit, etc., illustrated in FIGS. 1 to 5, may be formed in the memory cell region (MCR).

The gate structure 40 may include a gate insulation pattern 20. The gate structure may further include a gate electrode 30. The gate electrode 30 may be disposed on the gate insulation pattern 20. The gate insulation pattern 20 may include, for example, a silicon oxide or a metal oxide; however, exemplary embodiments of the present invention are not limited thereto. The gate electrode 30 may include, for example, a doped polysilicon, a metal, a metal silicide, or a metal nitride; however, exemplary embodiments of the present invention are not limited thereto. A gate spacer may be further formed on a lateral surface of the gate structure 40.

The impurity layer 105 may be formed on an upper portion of the substrate 100 adjacent the gate structure 40. The impurity layer 105 may include N-type impurities or P-type impurities.

The gate structure 40 and the impurity layer 105 adjacent the gate structure 40 may form a transistor. The transistor may be configured as a negative-channel metal oxide semiconductor (NMOS) transistor or a positive-channel metal oxide semiconductor (PMOS) transistor according to the conductivity type of the impurity layer 105. Accordingly, if the impurity layer 105 has a negative conductivity and includes N-type impurities, the transistor may be configured as a negative-channel metal oxide semiconductor (NMOS). Alternatively, if the impurity layer 105 is a positive conductivity and includes P-type impurities, the transistor may be configured as a positive-channel metal oxide semiconductor (PMOS).

The transistor may be covered by a first insulating interlayer 50 on the substrate 100. The first insulating interlayer 50 may include an oxide, for example, silicon oxide; however, exemplary embodiments of the present invention are not limited thereto.

The first contact plug 60 may extend through the first insulating interlayer 50. The first contact plug 60 may contact an upper surface of the impurity layer 105. According to an exemplary embodiment of the present invention, a plurality of first contact plugs 60 may be formed.

The wiring 70 may be formed on the first insulating interlayer 50. The wiring 70 may contact an upper surface of the first contact plug 60. According to an exemplary embodiment of the present invention, the wiring 70 may extend in the first direction and/or the second direction. Furthermore, a plurality of wirings 70 may be formed in the second direction and/or the first direction. According to the circuit layout, at least one of the wirings 70 may directly contact the overlying first conductive lines 120 and/or the second conductive lines 260. Alternatively, at least one of the wirings 70 may be electrically connected to the overlying first conductive lines 120 and/or the second conductive lines 260 via a second contact plug.

The wiring 70 may be covered by a second insulating interlayer 80 on the first insulating interlayer 50. The second insulating interlayer 80 may include an oxide, for example, silicon oxide; however, exemplary embodiments of the present invention are not limited thereto.

The first contact plug 60 and the wiring 70 may include, for example, a metal, a metal nitride, a metal silicide, and/or a doped polysilicon; however, exemplary embodiments of the present invention are not limited thereto.

Figure 22:
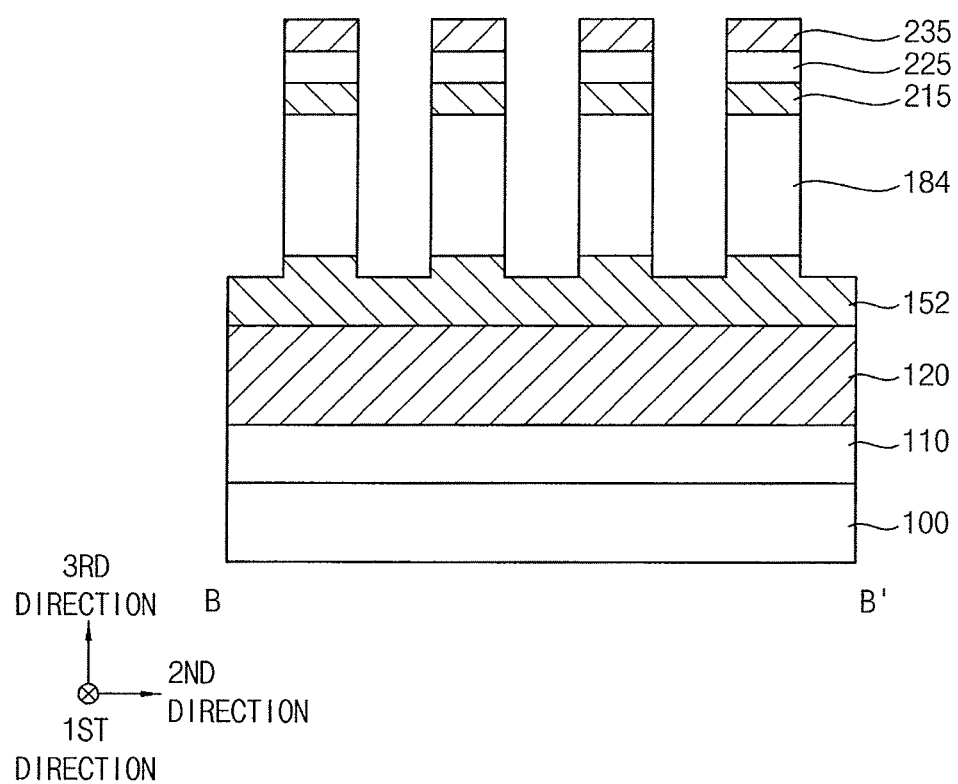
Figure 23:
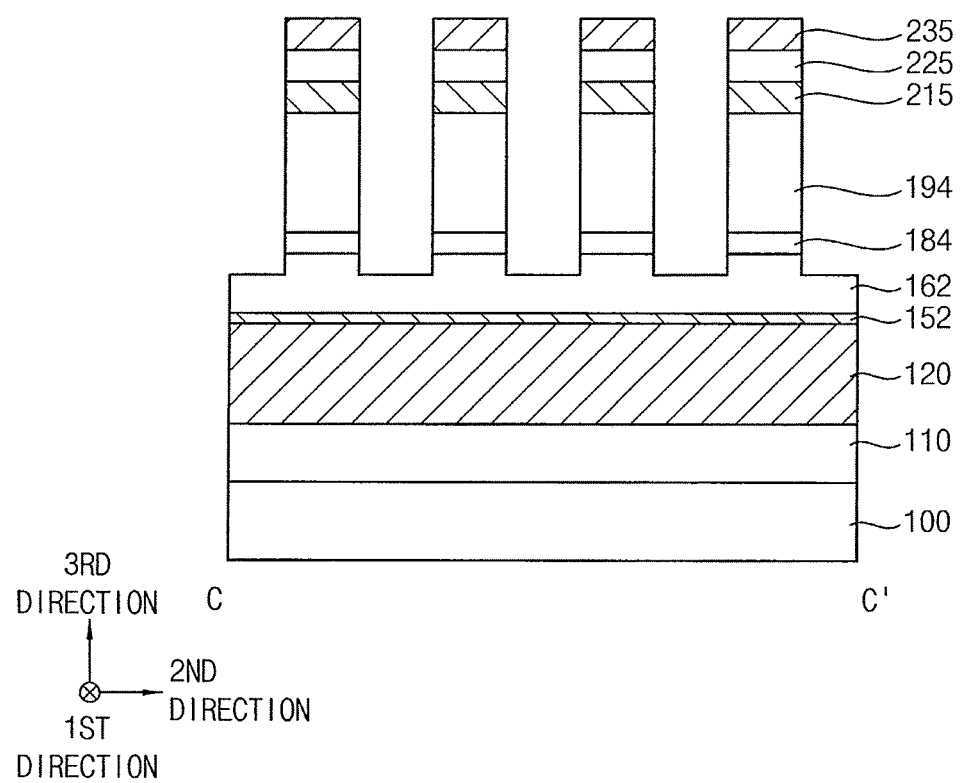

FIGS. 7 to 23 are plan views and cross-sectional views illustrating a method of manufacturing a variable resistance memory device according to an exemplary embodiment of the present invention. FIGS. 7, 9, 12, 16 and 20 are plan views. FIGS. 8, 10, 11, 13-15, 17-18 and 21 are cross-sectional views taken along lines A-A' of corresponding plan views. FIG. 22 is a cross-sectional view taken along a line B-B' of a corresponding plan view. FIG. 23 is a cross-sectional view taken along a line C-C' of a corresponding plan view.

Figure 7:
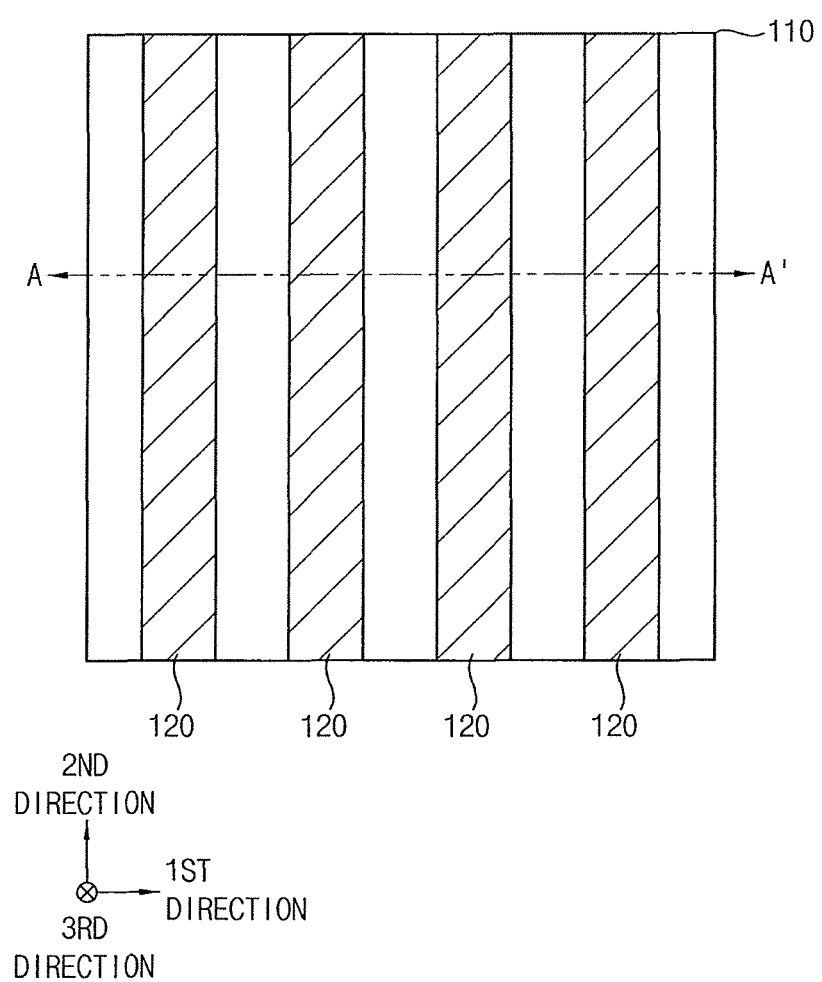
FIGS. 7 to 23 are plan views and cross-sectional views illustrating a method of manufacturing a variable resistance memory device according to an exemplary embodiment of the present invention.
Figure 8:
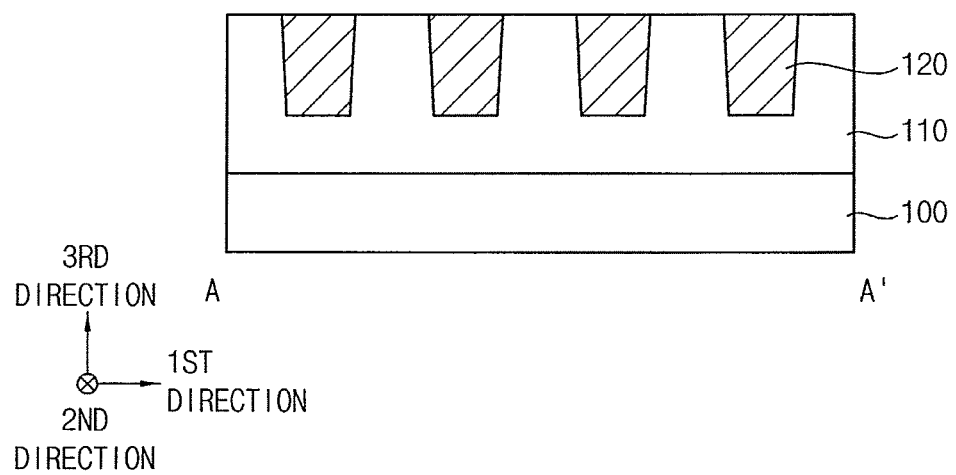

Referring to FIGS. 7 and 8, a first insulation layer 110 may be formed on a substrate 100. First conductive lines 120 may be formed on upper portions of the first insulation layer 110.

The substrate 100 may include a semiconductor material, for example, silicon (Si), germanium (Ge), silicon-germanium, or III-V semiconductor compounds, for example, gallium phosphide (GaP), gallium arsenide (GaAs), gallium antimonide (GaSb); however, exemplary embodiments of the present invention are not limited thereto. According to an exemplary embodiment of the present invention, the substrate 100 may be a silicon-on-insulator (SOI) substrate or a germanium-on-insulator (GOI) substrate.

Various elements, for example, gate structures, impurity layers, contact plugs, wirings may be formed on the substrate 100. The various elements may be covered by the first insulation layer 110.

The first insulation layer 110 may include an oxide, for example, silicon oxide; however, exemplary embodiments of the present invention are not limited thereto.

According to an exemplary embodiment of the present invention, the first conductive lines 120 may be formed by partially removing upper portions of the first insulation layer 110. The removal of the upper portions of the first insulation layer 110 may form first trenches. A first conductive layer may be formed on the first insulation layer 110 to fill the first trenches. The first conductive layer may be planarized and may expose an upper surface of the first insulation layer 110.

The first conductive layer may include a metal, for example, tungsten (W), platinum (Pt), palladium (Pd), rhodium (Rh), ruthenium (Ru), iridium (Ir), copper (Cu), aluminum (Al), titanium (Ti), or tantalum (Ta), or a metal nitride thereof; however, exemplary embodiments of the present invention are not limited thereto.

According to an exemplary embodiment of the present invention, each of the first conductive lines 120 may include a first metal pattern. Substantially each of the first conductive lines 120 may further include a first barrier pattern. The first barrier pattern may cover a lateral surface and a lower surface of the first metal pattern. The first metal pattern may include a metal; however, exemplary embodiments of the present invention are not limited thereto. The first barrier pattern may include a metal nitride, for example, titanium nitride (TiN), tantalum nitride (TaN), or tungsten nitride; however, exemplary embodiments of the present invention are not limited thereto.

Alternatively, the first conductive lines 120 may be formed by forming a first conductive layer on the first insulation layer 110 and patterning the first conductive layer.

According to an exemplary embodiment of the present invention, each of the first conductive lines 120 may be formed to extend in the second direction. Furthermore, a plurality of first conductive lines 120 may be formed in the first direction. The plurality of first conductive lines 120 formed in the first direction may be spaced apart from each other.

Figure 9:
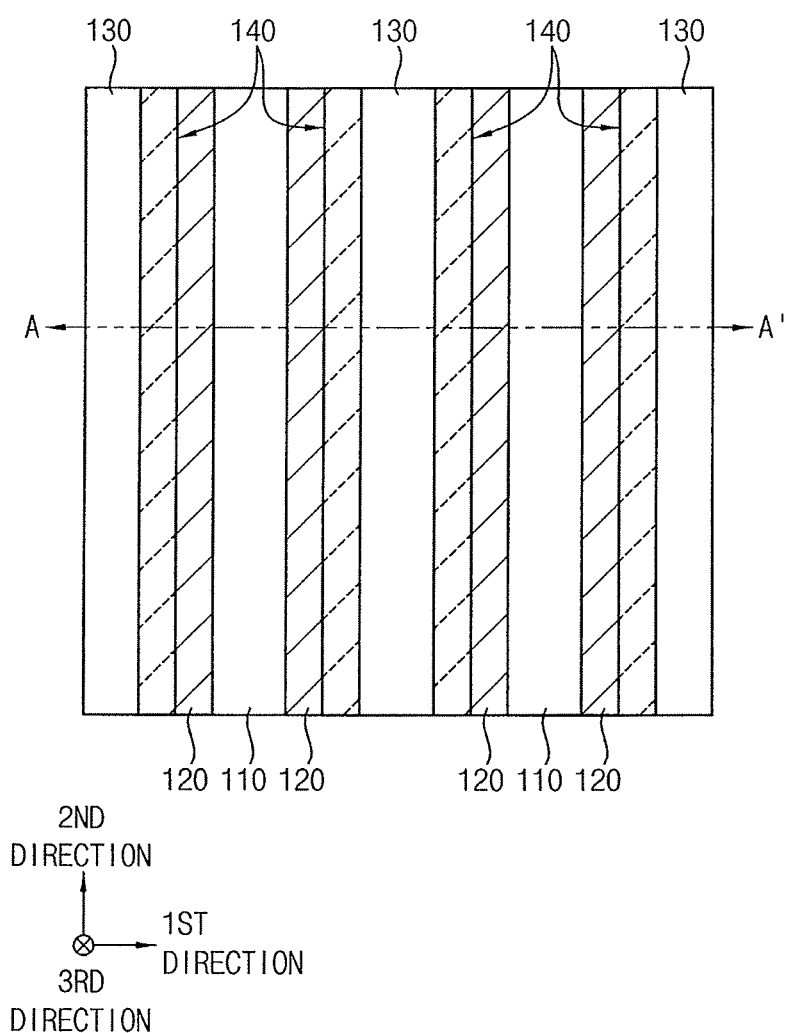
Figure 10:
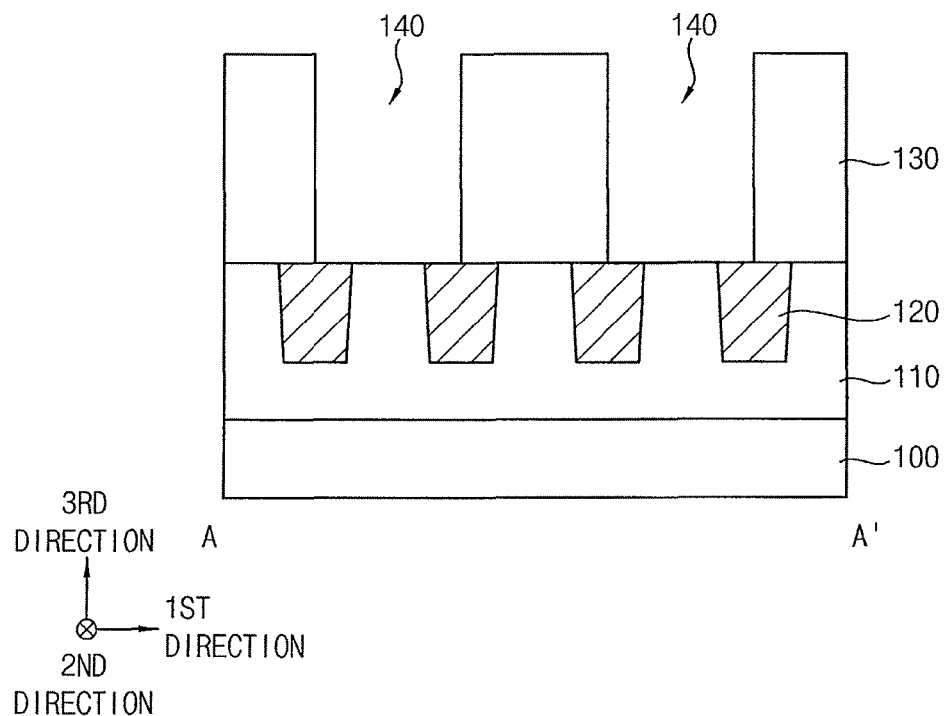

Referring to FIGS. 9 and 10, a second insulation layer 130 may be formed on the first insulation layer 110 and the first conductive lines 120. An opening 140 may be formed through the second insulation layer 130. The opening 140 may partially expose an upper surface of each of the first conductive lines 120.

The second insulation layer 130 may include a nitride, for example, silicon nitride ($Si_3N_4$); however, exemplary embodiments of the present invention are not limited thereto.

According to an exemplary embodiment of the present invention, the opening 140 may expose upper surfaces of adjacent first conductive lines 120, respectively, in the first direction. The opening 140 may further expose an upper surface of the first insulation layer 110 disposed between adjacent first conductive lines 120. A plurality of openings 140 may be formed in the first direction. According to an exemplary embodiment of the present invention, the opening 140 may extend in the second direction. The opening 140 may expose about half of the upper surface of each of the first conductive lines 120; however, exemplary embodiments of the present invention are not limited thereto.

Figure 11:
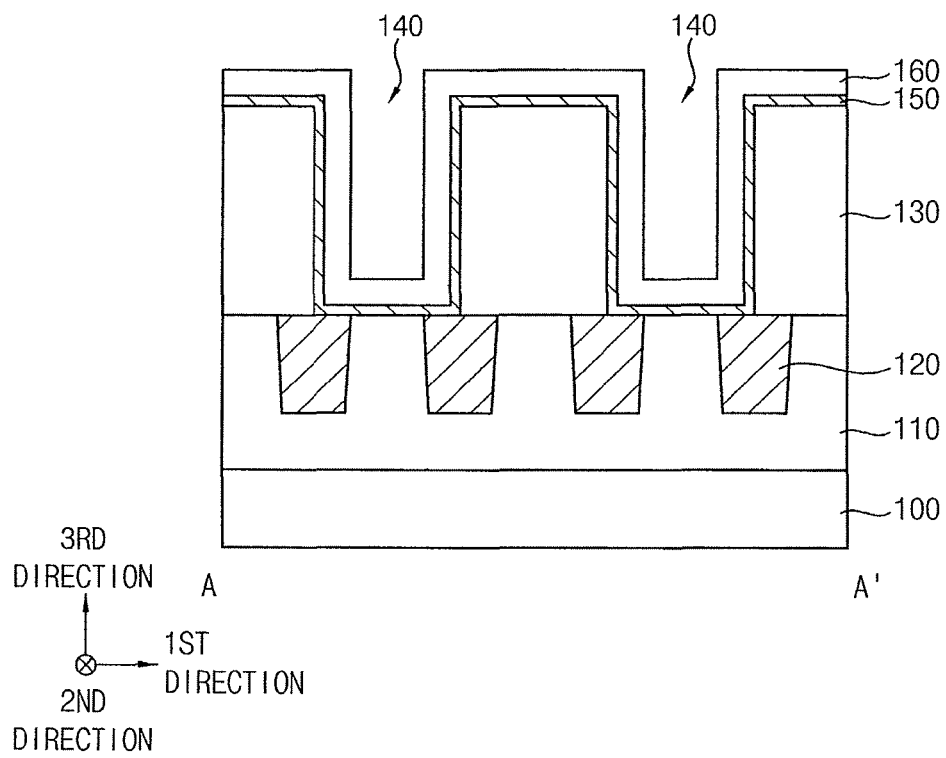

Referring to FIG. 11, a first electrode layer 150 and a first spacer layer 160 may be formed on lateral surfaces of the openings 140. The openings 140 may expose upper surfaces of the first conductive lines 120, an upper surface of the first insulation layer 110, and an upper surface of the second insulation layer 130.

According to an exemplary embodiment of the present invention, each of the first electrode layer 150 and the first spacer layer 160 may be conformally formed. According to an exemplary embodiment of the present invention, the first electrode layer 150 may be formed to have a thickness less than a width in the first direction of the upper surface of the first conductive line 120 exposed by the opening 140.

The first electrode layer 150 may include carbon, a metal containing carbon, or a metal nitride containing carbon. For example, the first electrode layer 150 may include carbon, carbonitride, titanium carbonitride and/or tantalum carbonitride; however, exemplary embodiments of the present invention are not limited thereto.

The first spacer layer 160 may include an oxide, for example, silicon oxide; however, exemplary embodiments of the present invention are not limited thereto. According to an exemplary embodiment of the present invention, the first spacer layer 160 may include a material substantially the same as the first insulation layer 110.

Figure 12:
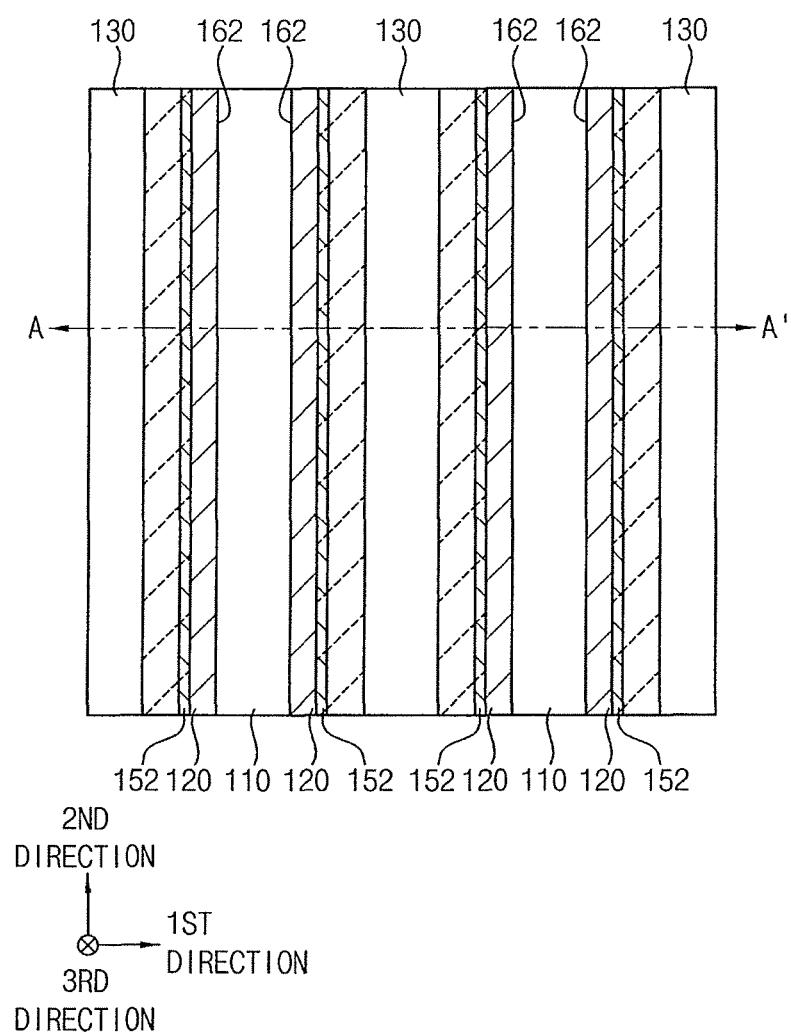
Figure 13:
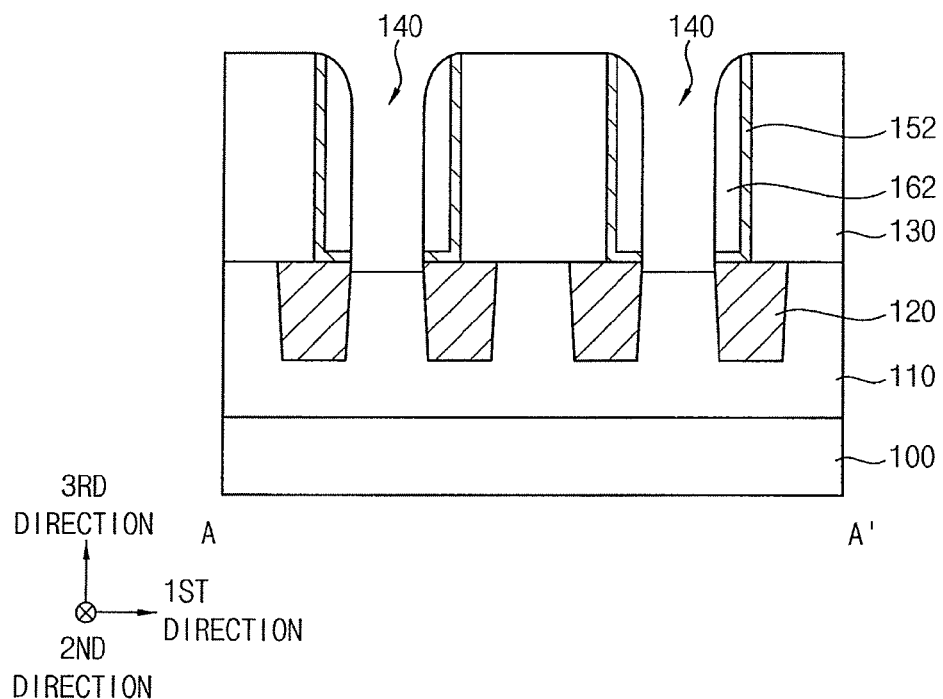

Referring to FIGS. 12 and 13, the first spacer layer 160 may be anisotropically etched to form a first spacer 162. The first spacer 162 may be formed on a lateral surface of the opening 140.

The first electrode layer 150 may be etched using the first spacer 162 as an etching mask to form a first electrode 152. The first electrode 152 may be formed on the lateral surface of the opening 140. A portion of the first insulation layer 110 disposed between adjacent first conductive lines 120 in the first direction may also be partially removed.

According to an exemplary embodiment of the present invention, the first electrode 152 may extend in the second direction on each of the first conductive lines 120. A plurality of first electrodes 152 may be formed in the first direction. The first electrode 152 may have an "L" shape in a cross-section taken along the first direction. Therefore, the first electrode 152 may include a vertical portion extending in the third direction on an upper surface of the first conductive line 120. The first electrode 152 may further include a horizontal portion. The horizontal portion of the first electrode 152 may be connected to the vertical portion. The horizontal portion of the first electrode 152 may further extend in the first direction on a portion of the upper surface of the first conductive line 120. According to an exemplary embodiment of the present invention, the first electrode 152 may be formed to have a substantially constant thickness on the lateral surfaces of the openings 140 and the upper surfaces of the first conductive lines 120.

A lateral surface of the first electrode 152 may be substantially aligned with a lateral surface of the first conductive line 120; however, exemplary embodiments of the present invention are not limited thereto. When the first spacer 162 is formed and has a thickness, the lateral surface of the first electrode 152 might not be substantially aligned with the lateral surface of the first conductive line 120. For example, an edge portion of the upper surface of the first conductive line 120 might not be covered by the first electrode 152 and the first spacer 162. Accordingly, an edge portion of the upper surface of the first conductive line 120 may be exposed.

Figure 14:
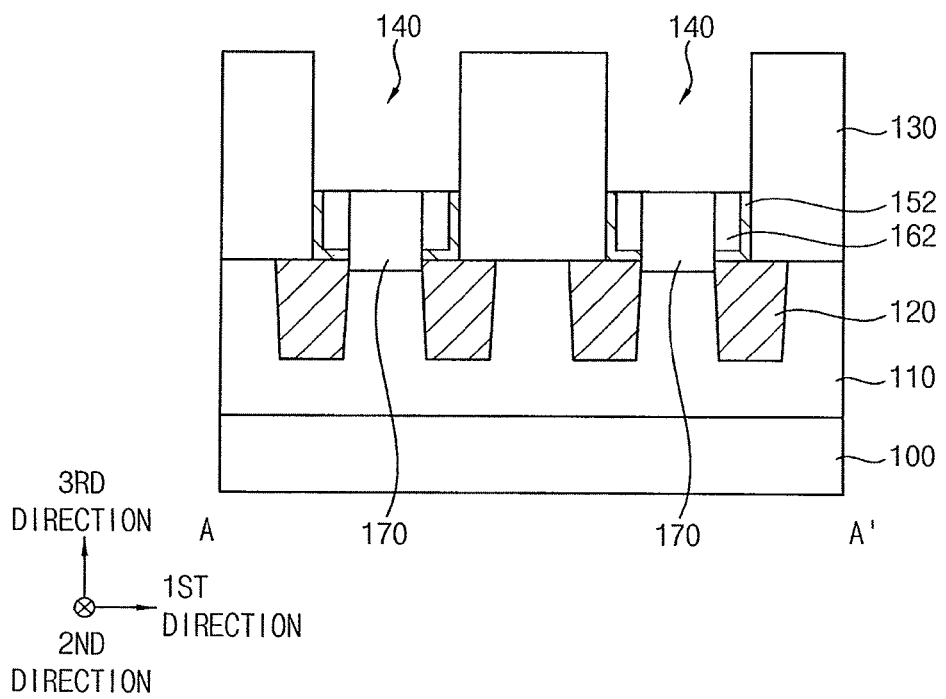

Referring to FIG. 14, a first filling layer may be formed on the first insulation layer 110. The first filling layer may also be formed on the first spacer 162. The first filling layer may fill the opening 140. Upper portions of the first filling layer and the first spacer 162 may be removed.

Therefore, the first filling layer may be transformed into a first filling pattern 170. The first spacer 162 may remain in a lower portion of the opening 140.

The first filling layer may include an oxide, for example, silicon oxide; however, exemplary embodiments of the present invention are not limited thereto. According to an exemplary embodiment of the present invention, the first filling layer may include a material substantially the same as the first spacer 162. Accordingly, the first filling layer may be merged with the first spacer 162.

A portion of the first electrode 152 not covered by the first filling pattern 170 and the first spacer 162 may be removed. Therefore, the first electrode 152 may remain on a lower lateral surface of the opening 140. The upper surface of the first conductive line 120 may have an "L" shape in a vertical cross-section.

Figure 15:
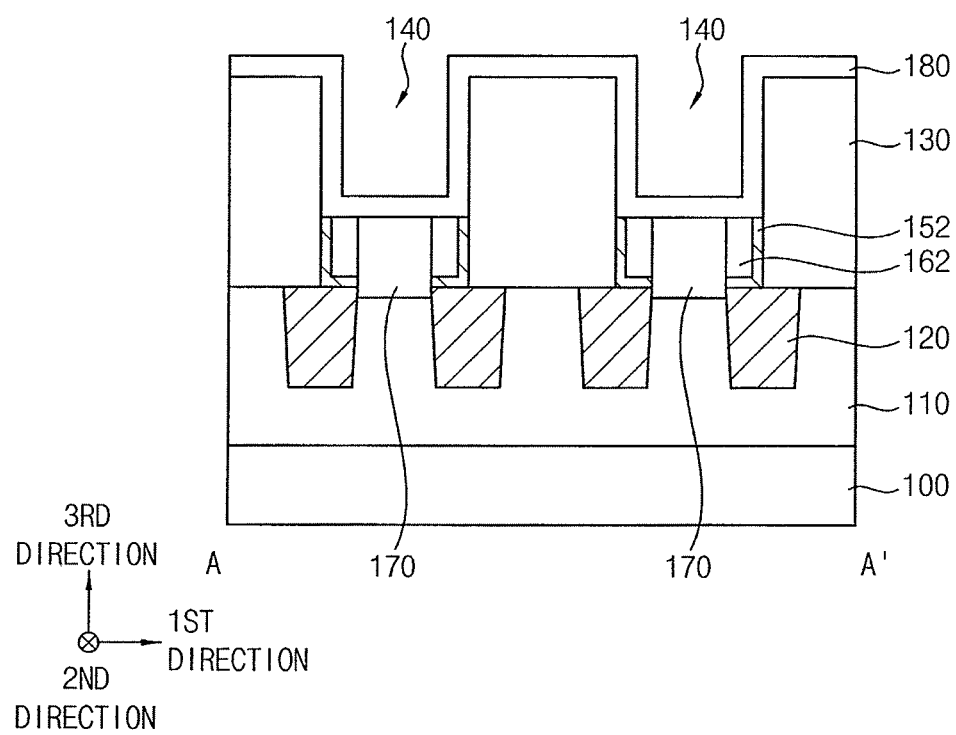

Referring to FIG. 15, a variable resistance layer 180 may be formed on upper lateral surfaces of the openings 140, the first electrodes 152, an upper surface of the first spacers 162, an upper surface of the first filling patterns 170, and an upper surface and lateral surfaces of the second insulation layer 130.

According to an exemplary embodiment of the present invention, the variable resistance layer 180 may be conformally formed. According to an exemplary embodiment of the present invention, the variable resistance layer 180 may be formed to have a thickness greater than a thickness of the first electrode 152.

According to an exemplary embodiment of the present invention, the variable resistance layer 180 may include a material having resistance which may be changed according to the phase change thereof. According to an exemplary embodiment of the present invention, the first variable resistance layer 180 may include chalcogenide material; however, exemplary embodiments of the present invention are not limited thereto. The chalogenide material may include germanium (Ge), antimony (Sb) and/or tellurium (Te). According to an exemplary embodiment of the present invention, the first variable resistance layer 180 may include a super lattice. The super lattice may have a multi-layered structure. The super lattice may include a germanium-tellurium (GeTe) layer and an antimony-tellurium layer ($Sb_2Te_3$); however, exemplary embodiments of the present invention are not limited thereto. The germanium-tellurium (GeTe) layer and the antimony-tellurium ($Sb_2Te_3$) layer may be alternately stacked. According to an exemplary embodiment of the present invention, the first variable resistance layer 180 may include an IST containing indium-antimony-tellurium or a BST containing bismuth-antimony-tellurium; however, exemplary embodiments of the present invention are not limited thereto.

According to an exemplary embodiment of the present invention, the first variable resistance layer 180 may include a perovskite-based material or a transition metal; however, exemplary embodiments of the present invention are not limited thereto. The perovskite-based material may include, for example, STO ($SrTiO_3$), BTO ($BaTiO_3$), PCMO ($Pr_{1-x}Ca_xMnO_3$) and/or the like. The transition metal oxide may include titanium oxide (TiOx), zirconium oxide (ZrOx), aluminum oxide (AlOx), hafnium oxide (HfOx), tantalum oxide (TaOx), niobium oxide (NbOx), cobalt oxide (CoOx), tungsten oxide (WOx), lanthanum oxide (LaOx) and/or zinc oxide (ZnOx).

According to an exemplary embodiment of the present invention, the first variable resistance layer 180 may include a material having a resistance which may be changed by a magnetic field or a spin transfer torque (STT). The variable resistance memory device may be a magnetic random access memory (MRAM) device. For example, the first variable resistance layer may include a ferromagnetic material, for example, iron (Fe), nickel (Ni), cobalt (Co), dysprosium (Dy), gadolinium (Gd) or the like; however, exemplary embodiments of the present invention are not limited thereto.

Figure 16:
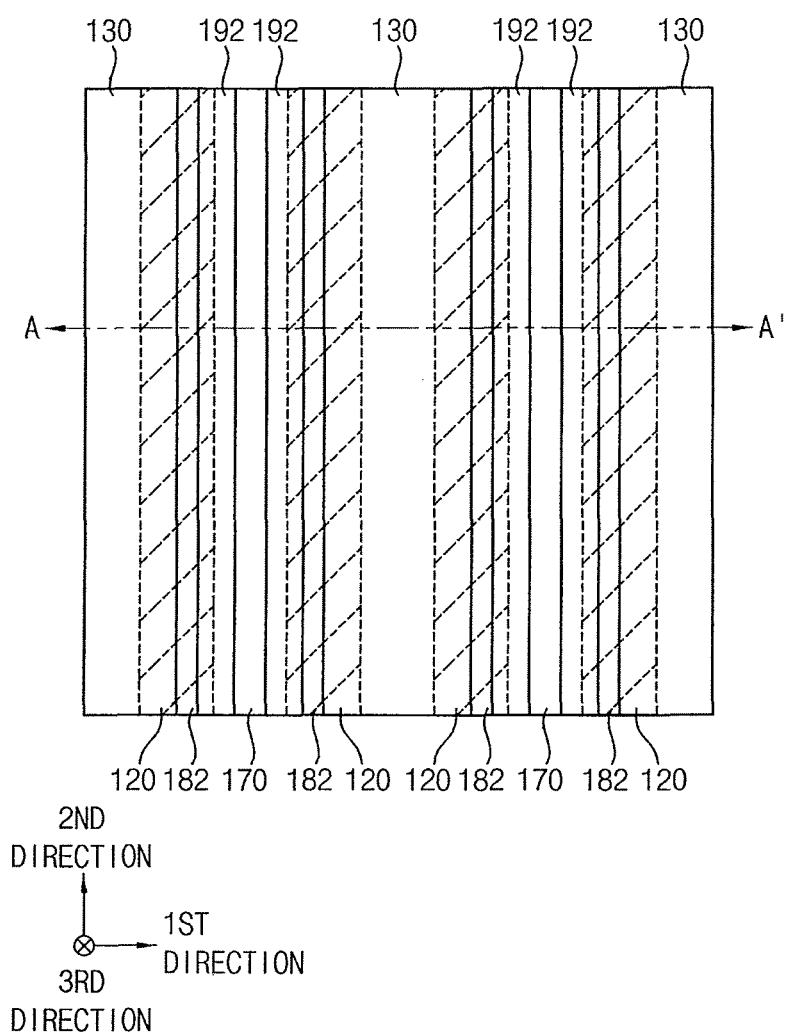
Figure 17:
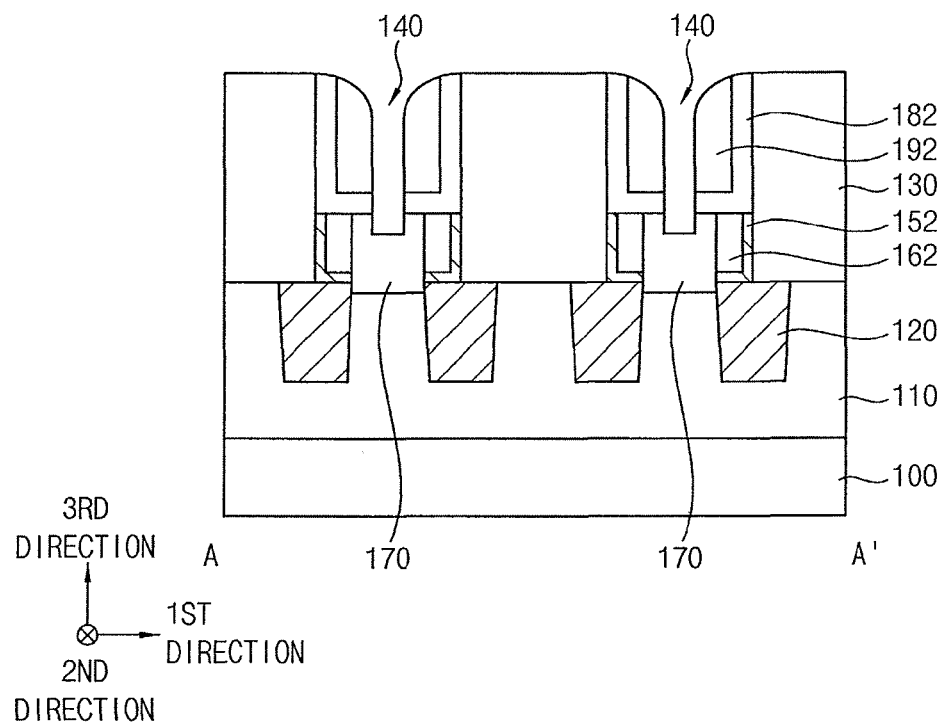

Referring to FIGS. 16 and 17, a second spacer layer may be formed on the variable resistance layer 180. The second spacer may be anisotropically etched to form a preliminary second spacer 192 on an upper lateral surface of the opening 140.

The variable resistance layer 180 may be etched using the preliminary second spacer 192 as an etching mask to form a preliminary variable resistance pattern 182. The preliminary variable resistance pattern 182 may be formed on the upper lateral surface of the opening 140. The first filling pattern 170 disposed on the variable resistance layer 180 may also be partially removed.

According to an exemplary embodiment of the present invention, the preliminary variable resistance pattern 182 may extend in the second direction on the first electrode 152 and the first spacer 162. A plurality of preliminary variable resistance patterns 182 may be formed in the first direction. The preliminary variable resistance pattern 182 may have an "L" shape in a cross-section taken along the first direction. Therefore, each of the preliminary variable resistance patterns 182 may include a vertical portion extending in the third direction on an upper surface of the first electrode 152. Each of the preliminary variable resistance patterns 182 may also include a horizontal portion. The horizontal portion of the preliminary variable resistance patterns 182 may be connected to the vertical portion. The horizontal portion of the preliminary variable resistance patterns 182 may further extend in the first direction on the first electrode 152 and the first spacer 162. According to an exemplary embodiment of the present invention, the preliminary variable resistance pattern 182 may have a substantially constant thickness on the upper lateral surface of the opening 140, the upper surfaces of the first electrode 152, and the first spacer 162.

According to an exemplary embodiment of the present invention, a lateral surface of the vertical portion of the preliminary variable resistance pattern 182 may be substantially aligned with a lateral surface of the underlying first electrode 152. Therefore, the lateral surfaces of the vertical portion of the preliminary variable resistance pattern 182 and the lateral surfaces of the first electrode 152 may be on the same plane extending in the third direction.

According to an exemplary embodiment of the present invention, a lower surface of the preliminary variable resistance pattern 182 may have a width in the first direction greater than a width of a lower surface of the first electrode 152; however, exemplary embodiments of the present invention are not limited thereto. A lateral surface of the preliminary variable resistance pattern 182 might not be substantially aligned with a lateral surface of the first electrode 152. However, according to an exemplary embodiment of the present invention, the lateral surface of the preliminary variable resistance pattern 182 may be substantially aligned with a lateral surface of the first electrode 152. A width in the first direction of the lower surface of the preliminary variable resistance pattern 182 may be less than a width of the lower surface of the first electrode 152.

Each of the preliminary variable resistance pattern 182 and the first electrode 152 may include a cross-section having an "L" shape. Furthermore, a lateral surface of the first variable resistance pattern 184 and a lateral surface of the first electrode 152 may be substantially aligned with each other. Accordingly, an area of the upper surface of the first electrode 152 may constantly contact the lower surface of the preliminary variable resistance pattern 182. If a plurality of preliminary variable resistance patterns 182 and a plurality of first electrodes 152 are be formed, the distribution of the contact areas therebetween may be substantially zero.

Figure 18:
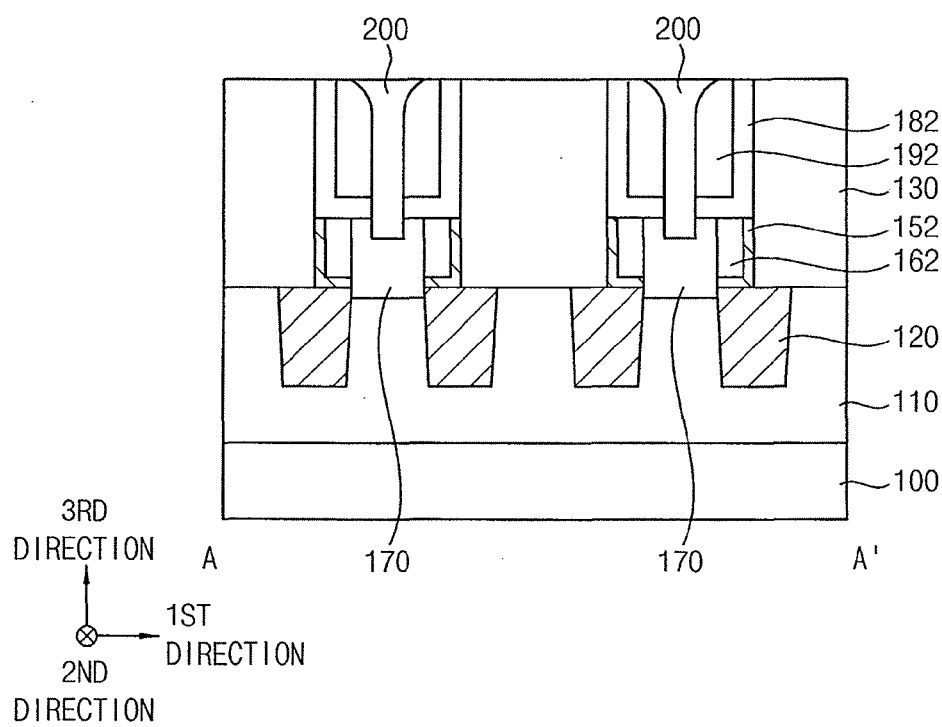

Referring to FIG. 18, a second filling layer 200 may be formed. The second filling layer 200 may fill a remaining portion of the opening 140.

The second filling layer 200 may include a nitride, for example, silicon nitride ($Si_3N_4$); however, exemplary embodiments of the present invention are not limited thereto. According to an exemplary embodiment of the present invention, the second filling layer 200 may include a material substantially the same as the preliminary second spacer 192. Therefore, the second filling layer 200 and the preliminary second spacer 192 may be merged.

Figure 19:
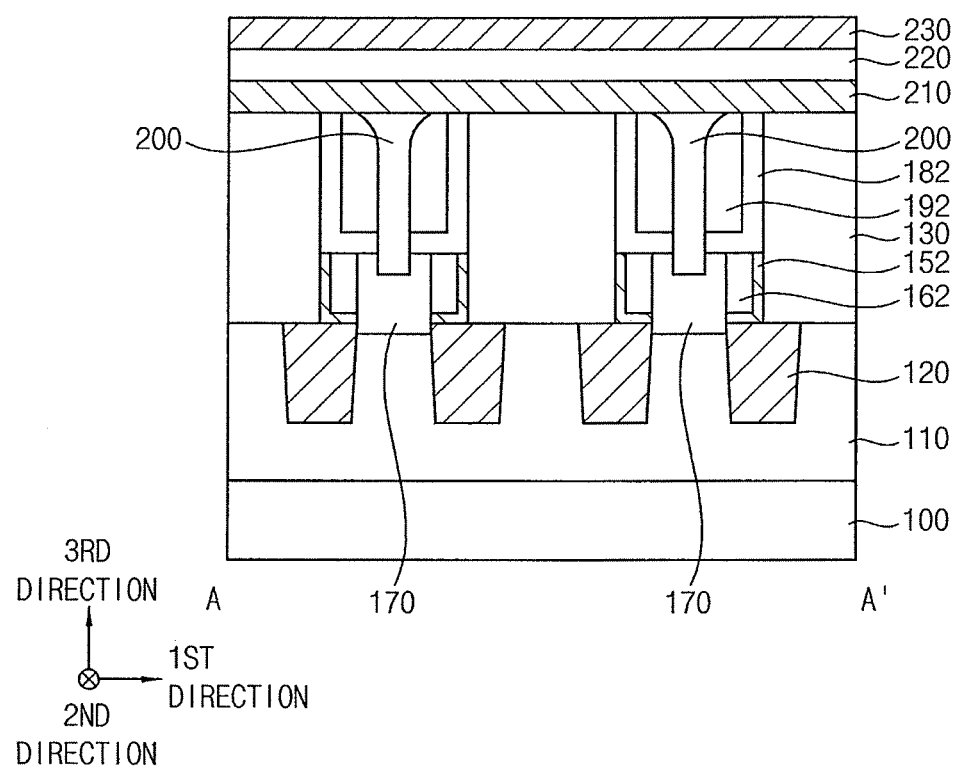
Figure 20:
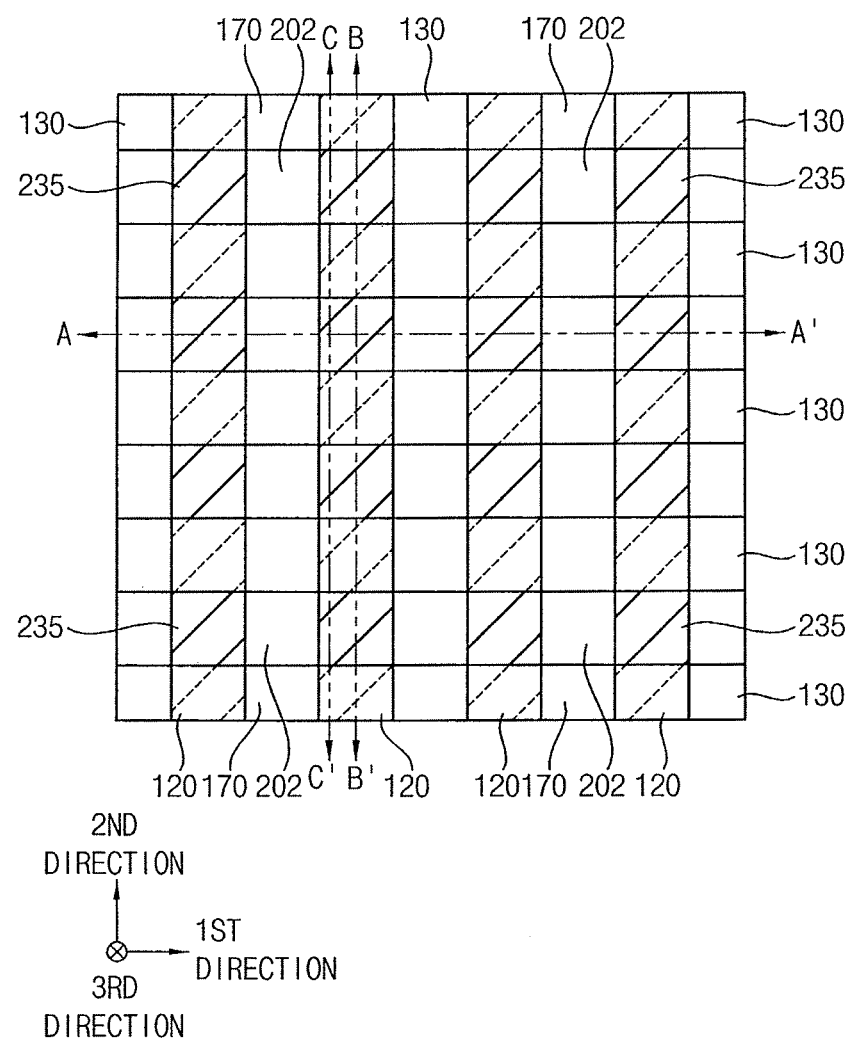
Figure 21:
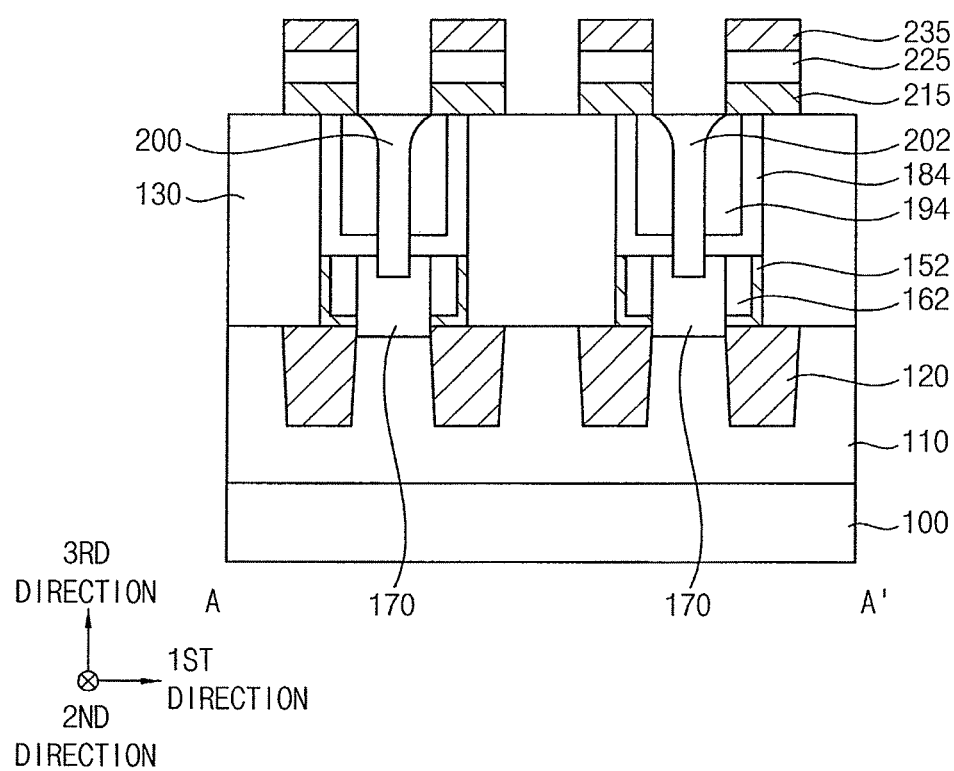

Referring to FIG. 19, a second electrode layer 210, a selection layer 220 and a third electrode layer 230 may be formed on the second insulation layer 130, the preliminary variable resistance pattern 182, the preliminary second spacer 192 and the second filling layer 200.

Each of the second electrode layer 210 and the third electrode layer 230 may include a metal nitride or a metal silicon nitride, for example, titanium nitride, titanium silicon nitride, tungsten nitride, tungsten silicon nitride, tantalum nitride, tantalum silicon nitride, zirconium nitride, and/or zirconium silicon nitride; however, exemplary embodiments of the present invention are not limited thereto.

According to an exemplary embodiment of the present invention, the selection layer 220 may include an ovonic threshold switch (OTS) material. The ovonic threshold switch (OTS) material may be configured as a switching element by the resistance difference due to the temperature difference in an amorphous state.

The ovonic threshold switch (OTS) material may include, for example, germanium (Ge), silicon (Si), arsenic (As) and/or tellurium (Te), and may further include selenium (Se) and/or sulfur (S); however, exemplary embodiments of the present invention are not limited thereto.

The ovonic threshold (OTS) material may include, for example, AsTeGeSiIn, GeTe, SnTe, GeSe, SnSe, AsTeGe-SiSbS, AsTeGeSiIP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}Se_{50}Sb_2$, $Si_5Te_{34}As_{28}Ge_{11}S_{21}Se_1$, AsTeGe-SiSeNS, AsTeGeSiP, AsSe, AsGeSe, AsTeGeSe, ZnTe, GeTePb, GeSeTe, AlAsTe, SeAsGeC, SeTeGeSi, GeSb-TeSe, GeBiTeSe, GeAsSbSe, GeAsBiTe, GeAsBiSe, and/or $Ge_xSe_{1-x}$, however exemplary embodiments of the present invention are not limited thereto.

Alternatively, the selection layer 220 may include a polysilicon (poly-Si) layer doped with N-type impurities. The selection layer 220 may further include a polysilicon (poly-Si) layer doped with P-type impurities. The polysilicon (poly-Si) layer doped with N-type impurities and the polysilicon (poly-Si) layer doped with P-type impurities may be stacked, for example, to form a diode.

Referring to FIGS. 20 to 23, the third electrode layer 230, the selection layer 220, the second electrode layer 210, the second filling layer 200, the preliminary second spacer 192 and the preliminary variable resistance pattern 182 may be patterned to form a preliminary third electrode, a preliminary selection pattern, a preliminary second electrode, a second filling pattern 202, a second spacer 194 and a first variable resistance pattern 184, respectively.

According to an exemplary embodiment of the present invention, the patterning process may be performed by forming a plurality of first etching masks. The etching masks may extend in the first direction on the third electrode layer 230 in the second direction. A dry etching process may be performed using the first etching masks.

Therefore, a plurality of preliminary third electrodes, a plurality of preliminary selection patterns and a plurality of preliminary second electrodes may be formed in the second direction. The preliminary third electrode, the preliminary selection pattern and the preliminary second electrode may extend in the first direction. Additionally, a plurality of second filling patterns 202, a plurality of second spacers 194 and a plurality of first variable resistance patterns 184 may be formed in the first direction and the second direction.

During the etching process, upper portions of the first electrode 152 and the first spacer 162 may be partially removed.

The preliminary third electrode, the preliminary selection pattern and the preliminary second electrode may be patterned to form a third electrode 235, a first selection pattern 225 and a second electrode 215, respectively.

According to an exemplary embodiment of the present invention, the patterning process may be performed by a dry etching process. The dry etching process may use a plurality of second etching masks. The second etching masks may extend in the second direction.

According to an exemplary embodiment of the present invention, a plurality of third electrodes 235, a plurality of first selection patterns 225 and a plurality of second electrodes 215 may be formed in the first direction and in the second direction.

The first electrode 152, the first variable resistance pattern 184, the second electrode 215, the first selection pattern 225 and the third electrode 235 may define a first memory unit. A plurality of first memory units may be formed in the second direction on each of the first conductive lines 120. A plurality of first conductive lines 120 may be formed in the first direction. Therefore, a plurality of first memory units may be also formed in the first direction.

Referring to FIGS. 1 to 4, a third insulation layer 240 may be formed on the second insulation layer 130, the first electrode 152, the first spacer 162, the first filling pattern 170, the second spacer 194 and the second filling pattern 202, The third insulation layer 240 may cover the first memory units. The third insulation layer 240 may be planarized to expose upper surfaces of the third electrodes 235 of the first memory units.

A fourth insulation layer 250 may be formed on the third insulation layer 240 and the third electrodes 235. A plurality of second conductive lines 260 may contact upper surfaces of the third electrodes 235 disposed in the first direction. The plurality of second conductive lines 260 may be formed in the second direction through the fourth insulation layer 250 to form the variable resistance memory device.

The third insulation layer 240 and the fourth insulation layer 250 may include a nitride, for example, silicon nitride; however, exemplary embodiments of the present invention are not limited thereto. According to an exemplary embodiment of the present invention, the third insulation layer 240 and the fourth insulation layer 250 may include a material substantially the same as the second insulation layer 130, the second filling pattern 202 and the second spacer 194. Therefore, the third insulation layer 240 and the fourth insulation layer 240 may be merged with the second insulation layer 130, the second filling pattern 202 and the second spacer 194.

According to an exemplary embodiment of the present invention, the second conductive lines 260 may be formed by partially removing the fourth insulation layer 250 to form second trenches. The second trenches may expose upper surfaces of the third electrodes 235 and the third insulation layer 240. A second conductive layer may be formed on the third electrodes 235. The third insulation layer 240 and the fourth insulation layer 250 may fill the second trenches. The second conductive layer may be planarized to expose an upper surface of the fourth insulation layer 250.

The second conductive layer may include, for example, tungsten (W), platinum (Pt), palladium (Pd), rhodium (Rh), ruthenium (Ru), iridium (Ir), copper (Cu), aluminum (Al), titanium (Ti), tantalum (Ta), or a metal nitride thereof; however, exemplary embodiments of the present invention are not limited thereto.

According to an exemplary embodiment of the present invention, the second conductive line 260 may include a second metal pattern. The second conductive line 260 may further include a second barrier pattern. The second barrier pattern may cover a lateral surface and a lower surface of the second metal pattern. The second metal pattern may include a metal. The second barrier pattern may include a metal nitride. However, exemplary embodiments of the present invention are not limited thereto.

Alternatively, the second conductive lines 260 may be formed by forming a second conductive layer on the third electrodes 235 and the third insulation layer 240 and patterning the second conductive layer.

According to an exemplary embodiment of the present invention, the first conductive line 120 may be configured as a word line of the variable resistance memory device. The second conductive line 260 may be configured as a bit line of the variable resistance memory device. Alternatively, the first conductive line 120 may be configured as a bit line of the variable resistance memory device. The second conductive line 260 may be configured as a word line of the variable resistance memory device.

According to an exemplary embodiment of the present invention, in a method of manufacturing a variable resistance memory device, the first electrode 152 and the first variable resistance pattern 184 each having an "L" shaped cross-section may be formed on lower and upper lateral surfaces of the opening 140, respectively, and may be substantially aligned with each other. Therefore, the contact areas between the first electrodes 152 and the first variable resistance patterns 184 may be substantially constant.

Additionally, the first variable resistance pattern 184 may be formed by conformally forming the variable resistance layer 180 on the upper lateral surface of the opening 140, the first electrode 152 and the first spacer 162. The variable resistance layer 180 may use the preliminary second spacer 192 as an etching mask to divide the variable resistance layer 180 into a plurality of preliminary variable resistance patterns 182. An etching process may be performed using the second etching mask extending in the first direction. Accordingly, the first variable resistance pattern 184 might not be formed by etching processes using two etching masks extending in the first and second directions, respectively. The first variable resistance pattern 184 may be formed by a single etching process using an etching mask extending in the first direction. Accordingly, the first variable resistance pattern 184 may have reduced etching damage.

When the first insulation layer 110, the first spacer 162 and the first filling pattern 170 include substantially the same material and the second insulation layer 130, the third insulation layer 240, the fourth insulation layer 250, the second spacer 194 and the second filling pattern 202 include substantially the same material, the variable resistance memory device as illustrated in FIG. 5 may be formed.

Figure 24:
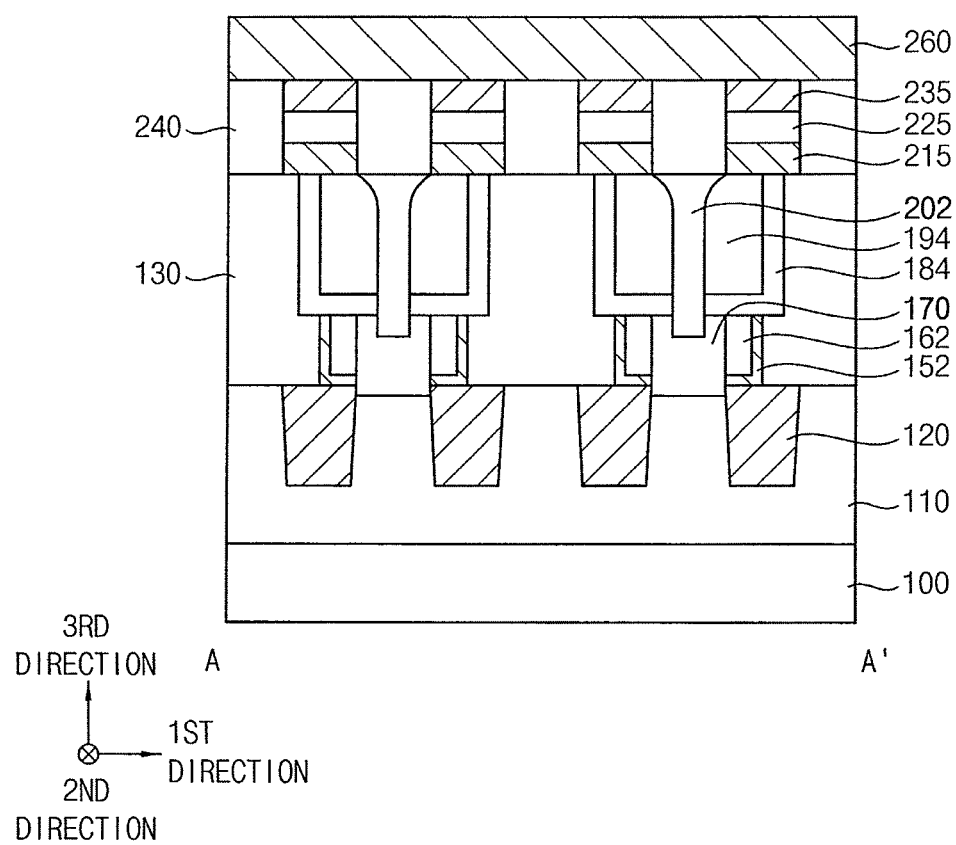
FIG. 24 is a cross-sectional view illustrating a variable resistance memory device according to an exemplary embodiment of the present invention.

FIG. 24 is a cross-sectional view illustrating a variable resistance memory device according to an exemplary embodiment of the present invention. The variable resistance memory device may be substantially the same as or similar to the variable resistance memory device as illustrated in FIGS. 1 to 6. However, the size and location of the first variable resistance pattern may be different.

Referring to FIG. 24, each of the first variable resistance pattern 84 and the first electrode 152 may have an "L" shape in a cross-section taken along the first direction. However, the lateral surface of the vertical portion of the first variable resistance pattern 184 might not be substantially aligned with the lateral surface of the vertical portion of the first electrode 152. For example, the lateral surfaces of the vertical portions of the first variable resistance pattern 184 and the lateral surfaces of the vertical portions of the first electrode 152 might not be formed on the same plane extending in the third direction.

According to an exemplary embodiment, a width in the first direction of the lower surface of the first variable resistance pattern 184 may be greater a width of the lower surface of the first electrode 152. Therefore, if the lateral surfaces of the first variable resistance pattern 184 and the lateral surfaces first electrode 152 are not substantially aligned with each other, the contact area between the upper surface of the first electrode 152 and the lower surface of the first variable resistance pattern 184 may be substantially constant. Accordingly, the variable resistance memory device including the plurality of first variable resistance patterns 184 and the plurality of first electrodes 152 may have a reduced characteristic distribution.

Figure 25:
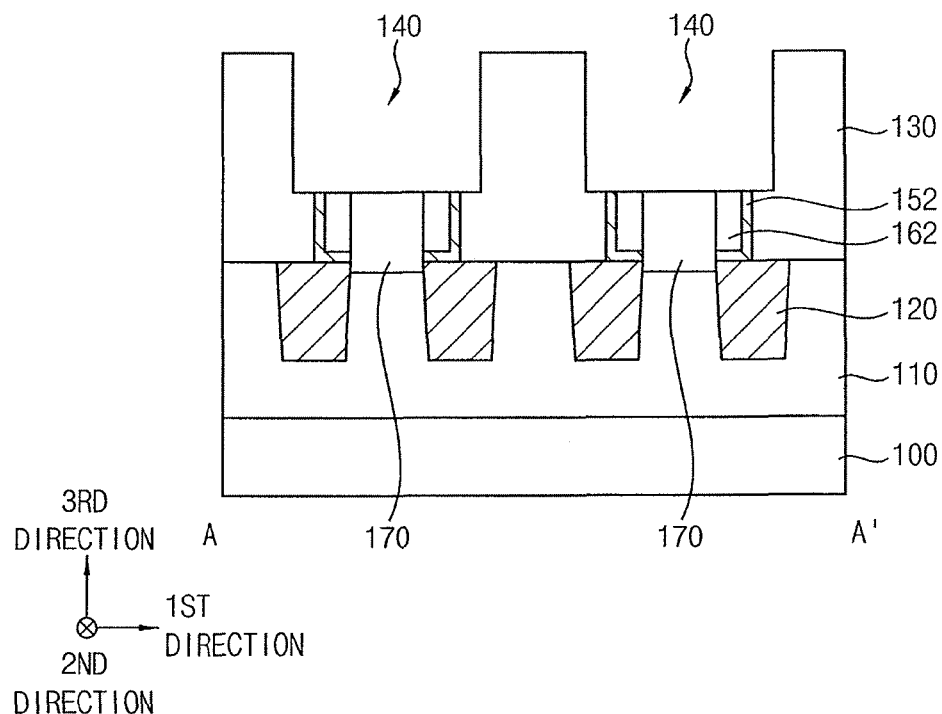
FIGS. 25 and 26 are cross-sectional views illustrating a method of manufacturing a variable resistance memory device according to an exemplary embodiment of the present invention.
Figure 26:
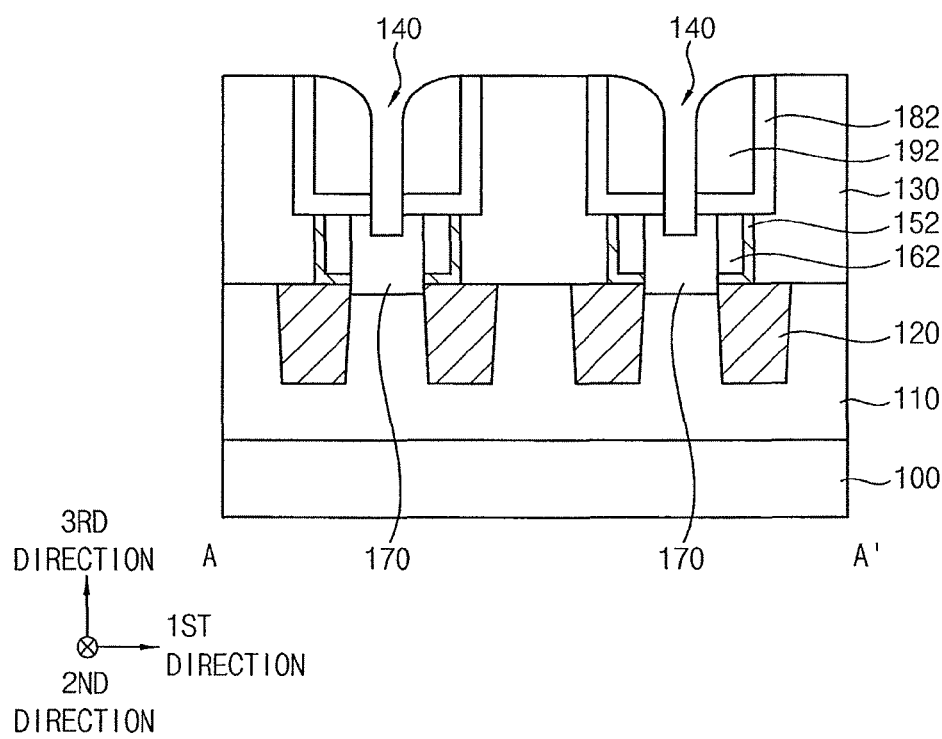

FIGS. 25 and 26 are cross-sectional views illustrating a method of manufacturing a variable resistance memory device according to an exemplary embodiment of the present invention. The method may include processes substantially the same as or similar as those illustrated in FIGS. 7 to 23 and FIGS. 1 to 6.

Referring to FIG. 25, when the portion of the first electrode 152 on the upper lateral surface of the opening 140 is removed, a portion of the second insulation layer 130 adjacent thereto in the first direction may be also removed. Therefore, a width of the opening 140 may be enlarged.

Referring to FIG. 26, the preliminary variable resistance pattern 182 may be formed on the upper lateral surface of the enlarged opening 140. The first electrode 152, the first spacer 162, and the preliminary second spacer 192 may be formed to cover a lateral surface of the vertical portion and an upper surface of the horizontal portion of the preliminary variable resistance pattern 182.

The lateral surface of the vertical portion of the preliminary variable resistance pattern 182 might not be substantially aligned with a lateral surface of the first electrode 152. However, the first electrode 152 may have a substantially constant thickness on the lower lateral surface of the opening 140. The preliminary variable resistance pattern 182 may be formed to cover substantially the entire upper surface of the vertical portion of the first electrode 152. Therefore, the contact area between the preliminary variable resistance pattern 182 and the upper surface of the vertical portion of the first electrode 152 may be substantially constant.

Referring to FIG. 24, processes substantially the same as or similar to processes illustrated in FIGS. 18 to 23 and FIGS. 1 to 6 may be performed to form the variable resistance memory device.

Figure 27:
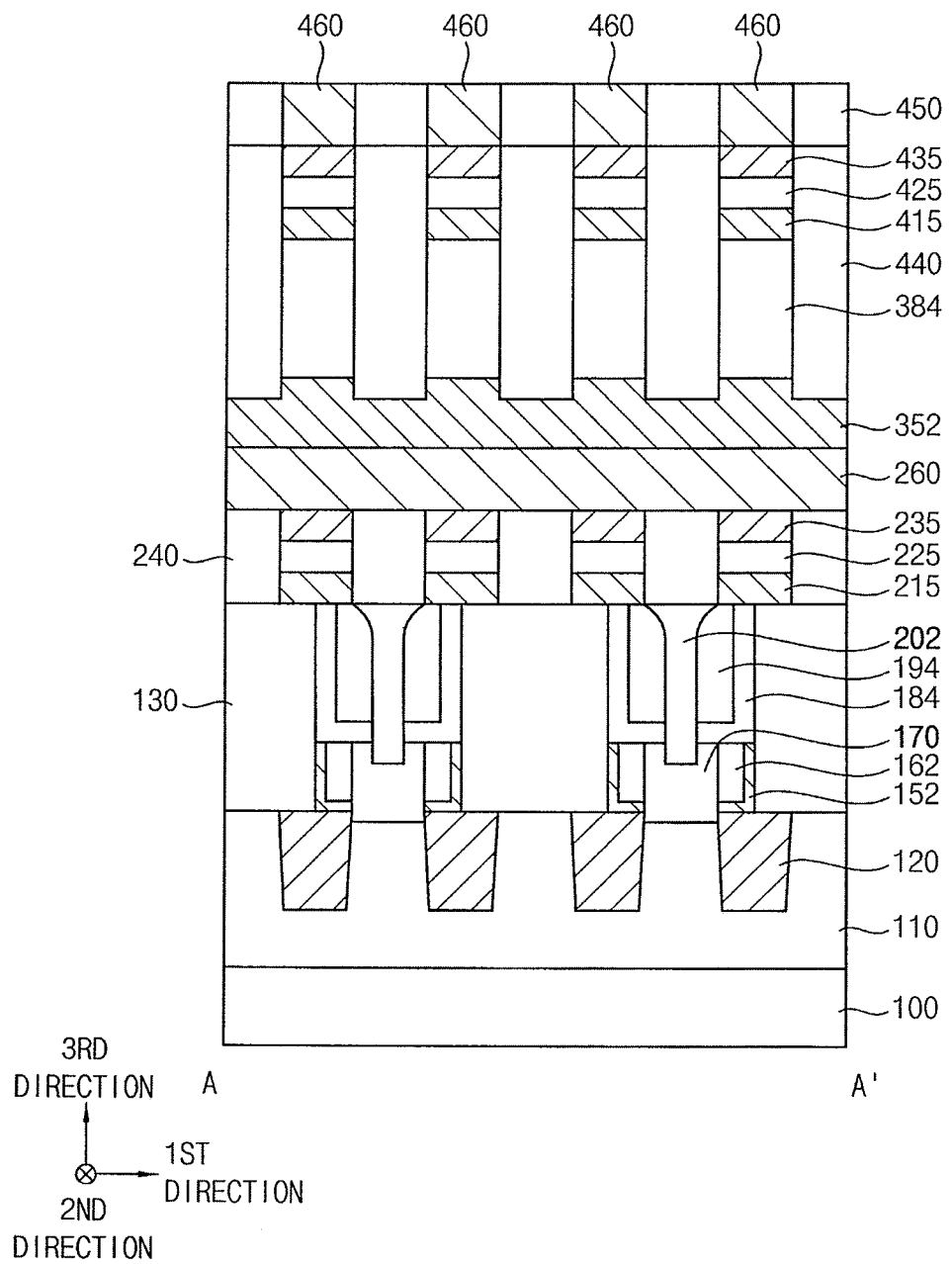
FIGS. 27 and 28 are cross-sectional views illustrating a variable resistance memory device according to an exemplary embodiment of the present invention.
Figure 28:
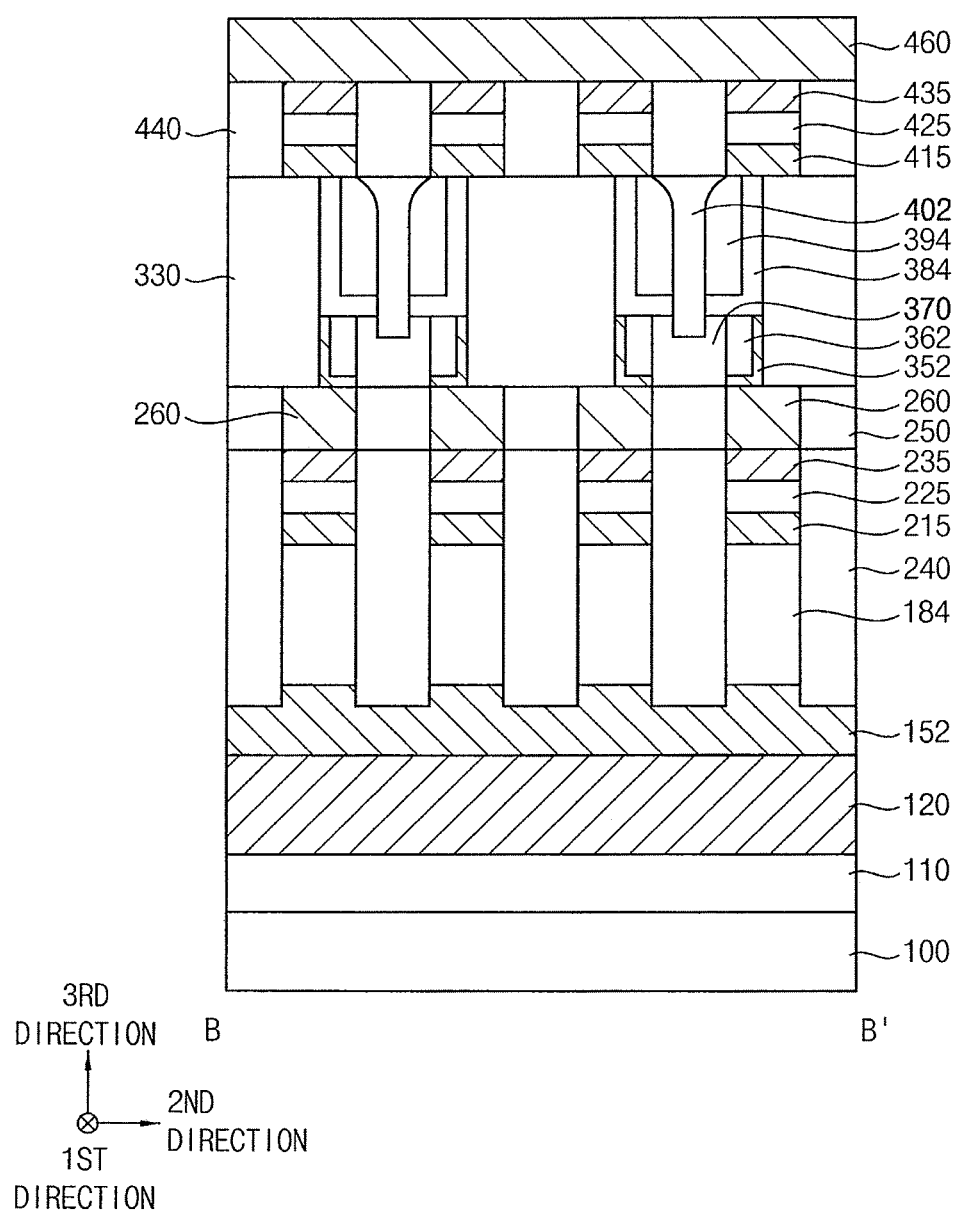

FIGS. 27 and 28 are cross-sectional views illustrating a variable resistance memory device according to an exemplary embodiment of the present invention. The variable resistance memory device may include a stacked structure. The stacked structure may include a variable resistance memory device of FIGS. 1 to 4.

Referring to FIGS. 27 and 28, the variable resistance memory device may include a first memory structure and a second memory structure. The first memory structure and the second memory structure may be stacked in the third direction. The first memory structure may be substantially the same as the variable resistance memory device illustrated in FIGS. 1 to 4.

The second memory structure may include substantially the same second conductive line 260 as the first memory structure. The second memory structure may include elements corresponding to elements of the first memory structure.

In particular, the second memory structure may include a third conductive line 460 on the fourth insulation layer 250 containing the second conductive line 260, and a second memory unit. The variable resistance memory device may further include a seventh insulation layer 330, an eighth insulation layer 440, and a ninth insulation layer 450. The variable resistance memory device may also include a third spacer 362 and a fourth spacer 394. The variable resistance memory device may further include a third filling pattern 370 and a fourth filling patterns 402.

The second memory unit may be formed between the second conductive line 260 and the third conductive line 460. The second memory unit may be formed at a region at which the second conductive line 260 and the third conductive line 460 overlap each other in the third direction. A plurality of second memory units may be formed on each of the second conductive lines 260 in the first direction. Furthermore, the plurality of second memory units may overlap the third conductive lines 460, respectively. A plurality of second conductive lines 260 may be formed in the second direction. Therefore, a plurality of second memory units may be also formed in the second direction.

The second memory unit may include a fourth electrode 452, a second variable resistance pattern 384, a fifth electrode 415, a second selection pattern 425 and a sixth electrode 435 stacked.

According to an exemplary embodiment of the present invention, the first conductive line 120 and the second conductive line 260 may be configured as a word line and a bit line, respectively, of the first memory structure. The second conductive line 260 and the third conductive line 460 may be configured as a bit line and a word line, respectively, of the second memory structure.

Alternatively, the first conductive line 120 and the second conductive line 260 may be configured as a bit line and a word line, respectively, of the first memory structure. The second conductive line 260 and the third conductive line 460 may be configured as a word line and a bit line, respectively, of the second memory structure.

FIGS. 27 and 28 illustrate a variable resistance memory device. The variable resistance memory device may include the second memory structure disposed on the first memory structure; however, exemplary embodiments of the present invention are not limited thereto. The variable resistance memory device may include a plurality of memory structures disposed on each other, respectively.

According to an exemplary embodiment of the present invention, the variable resistance memory device may be used in parameter random-access memory (PRAM) devices, resistive random-access memory (ReRAM) devices, and/or magnetoresistive random-access memory (MRAM) devices; however, exemplary embodiments of the present invention are not limited thereto.

The foregoing is illustrative of exemplary embodiments of the present invention and is not to be construed as limiting thereof. Although exemplary embodiments of the present invention have been described herein, those skilled in the art will readily appreciate that many modifications may be made to the exemplary embodiments without department from the spirit and scope of the present invention. Accordingly, all such modifications are intended to be included within the scope of the present inventive concept as defined in the appended claims.

What is claimed is:

1. A variable resistance memory device, comprising:
a substrate;
a first insulation layer disposed on the substrate;
first conductive lines arranged in a first direction on the first insulation layer, each of the first conductive lines extending in a second direction substantially perpendicular to the first direction, and the first direction and the second direction being substantially parallel to an upper surface of the substrate;
second conductive lines disposed over the first conductive lines and arranged in the second direction, each of the second conductive lines extending in the first direction; and
a plurality memory units each disposed in each area between the first conductive lines and the second conductive lines in a third direction, the memory units including:
a first electrode having an "L" shaped cross-section taken along the first direction;
a variable resistance pattern contacting an upper surface of the first electrode, the variable resistance pattern having an "L" shaped cross-section taken along the first direction;
a second electrode disposed on the variable resistance pattern; and
a selection pattern disposed on the second electrode.

2. The variable resistance memory device of claim 1, wherein a lateral surface of the first electrode and a lateral surface of the variable resistance pattern are formed on a same plane extending in the third direction.

3. The variable resistance memory device of claim 1, wherein a width in the first direction of a lower surface of the variable resistance pattern is greater than a width in the first direction of a lower surface of the first electrode.

4. The variable resistance memory device of claim 1, wherein the first electrode extends in the second direction on each of the first conductive lines,
and the memory unit includes a plurality of variable resistance patterns spaced apart from each other in the second direction on the first electrode.

5. The variable resistance memory device of claim 1, further comprising:
a first spacer disposed on a lateral surface of the first electrode; and
a second spacer disposed on a lateral surface of the variable resistance pattern.

6. The variable resistance memory device of claim 5, wherein the first spacer includes an oxide and the second spacer includes a nitride.

7. The variable resistance memory device of claim 5, wherein the lateral surface of the first electrode and the lateral surface of the variable resistance pattern are on the same plane extending in the third direction,
and the variable resistance memory device further comprises a second insulation layer covering a lateral surface of the first electrode and a lateral surface of the variable resistance pattern.

8. The variable resistance memory device of claim 7, wherein the first insulation layer pattern includes a nitride,
and the variable resistance memory device further comprises a first filling pattern covering another lateral surface of the first electrode, the first filling pattern including an oxide.

9. The variable resistance memory device of claim 1, further comprising a third electrode disposed on the selection pattern, the third electrode contacting each of the second conductive lines.

10. The variable resistance memory device of claim 1, wherein the selection pattern includes an ovonic threshold switch (OTS) material containing germanium, silicon, arsenic and/or tellurium.

11. The variable resistance memory device of claim 1, wherein the selection pattern includes at least one of AsTeGeSiIn, GeTe, SnTe, GeSe, SnSe, AsTeGeSiSbS, AsTeGeSiInP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, Te$_{28}$As$_{34.5}$Ge$_{15.5}$S$_{22}$, Te$_{39}$As$_{36}$Si$_{17}$Ge$_7$P, As$_{10}$Te$_{21}$S$_2$Ge$_{15}$Se$_{50}$Sb$_2$, Si$_5$Te$_{34}$As$_{28}$Ge$_{11}$S$_{21}$Se$_1$, AsTeGe-SiSeNS, AsTeGeSiP, AsSe, AsGeSe, AsTeGeSe, ZnTe, GeTePb, GeSeTe, AlAsTe, SeAsGeC, SeTeGeSi, GeSb-TeSe, GeBiTeSe, GeAsSbSe, GeAsBiTe, GeAsBiSe, or Ge$_x$Se$_{1-x}$.

12. The variable resistance memory device of claim 1, wherein the variable resistance pattern includes a phase-change material.

13. A variable resistance memory device, comprising:
   first conductive lines disposed over a substrate in a first direction, each of the first conductive lines extending in a second direction substantially perpendicular the first direction, and the first direction and the second direction being substantially parallel to an upper surface of the substrate;
   a first electrode extending in the second direction disposed on each of the first conductive lines, the first electrode having an "L" shaped cross-section taken along the first direction;
   a plurality of variable resistance patterns spaced apart from each other in the second direction disposed on the first electrode, each of the variable resistance patterns having an "L" shaped cross-section;
   a second electrode disposed on the variable resistance patterns; and
   a selection pattern disposed on the second electrode, wherein
   a lateral surface of each of the variable resistance patterns and a lateral surface of the first electrode are disposed on the same plane extending in a third direction substantially perpendicular to the upper surface of the substrate.

14. The variable resistance memory device of claim 13, wherein a width in the first direction of a lower surface of the variable resistance patterns is greater than a width in the first direction of a lower surface of the first electrode.

15. The variable resistance memory device of claim 13, further comprising:
   a third electrode disposed on the selection pattern; and
   a plurality of second conductive lines disposed in the second direction, each of the plurality of second conductive lines extending in the first direction and contacting upper surfaces of the third electrodes, the upper surfaces of the third electrodes spaced apart from each other in the first direction.

16. The variable resistance memory device of claim 13, wherein the selection pattern includes an ovonic threshold switch (OTS) material containing germanium, silicon, arsenic and/or tellurium.

17. The variable resistance memory device of claim 13, wherein a distribution of contact areas between the first electrode and the first variable resistance pattern is substantially zero.

18. A method of manufacturing a variable resistance memory device, the method comprising:
   forming a first insulation layer on a substrate;
   forming a plurality of first conductive lines on the first insulation layer in a first direction;
   forming a second insulation layer on the first insulation layer and the first conductive lines in the first direction;
   forming a plurality of openings in the second insulation layer, the openings partially exposing upper surfaces of adjacent first conductive lines in the first direction;
   forming a first electrode on a lower lateral surface in each of the openings;
   forming a variable resistance pattern on an upper lateral surface in each of the openings;
   forming a second electrode on the variable resistance pattern; and
   forming a selection pattern on the variable resistance pattern, wherein
   a lateral surface of the first electrode and a lateral surface of the variable resistance pattern are formed on a same plane,
   wherein the first electrode and the variable resistance pattern include an "L" shaped vertical cross-section, and
   wherein a width of a lower surface of the variable resistance pattern is greater than a width of a lower surface of the first electrode.

19. The method of claim 18, wherein a distribution of contact areas between the first electrode and the variable resistance pattern is substantially zero.

20. The method of claim 18, further comprising forming a third electrode on the selection pattern, the third electrode contacting each of the second conductive lines.

* * * * *